United States Patent
Dor et al.

(10) Patent No.: US 11,689,221 B1
(45) Date of Patent: Jun. 27, 2023

(54) BCH FAST SOFT DECODING BEYOND THE (D-1)/2 BOUND

(71) Applicant: SAMSUNG ELECTRONICS CO., LTD., Suwon-si (KR)

(72) Inventors: Avner Dor, Kfar Saba (IL); Yaron Shany, Kfar Saba (IL); Ariel Doubchak, Herzliya (IL); Amit Berman, Binyamina (IL)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/647,441

(22) Filed: Jan. 7, 2022

(51) Int. Cl.
  *H03M 13/00* (2006.01)
  *H03M 13/15* (2006.01)
  *H03M 13/45* (2006.01)

(52) U.S. Cl.
  CPC ..... *H03M 13/152* (2013.01); *H03M 13/1575* (2013.01); *H03M 13/458* (2013.01)

(58) Field of Classification Search
  CPC ........... H03M 13/152; H03M 13/1575; H03M 13/458
  See application file for complete search history.

(56) References Cited

U.S. PATENT DOCUMENTS

| 8,171,368 | B1* | 5/2012 | Wu | H03M 13/45 |
| | | | | 714/752 |
| 8,381,082 | B1* | 2/2013 | Tang | H03M 13/153 |
| | | | | 714/759 |
| 8,674,860 | B2* | 3/2014 | Wu | H03M 13/1515 |
| | | | | 714/780 |

(Continued)

OTHER PUBLICATIONS

Xinmiao Zhang et al., Efficient One-Pass Chase Soft-Decision BCH Decoder for Multi-Level Cell NAND Flash Memory, 2011 IEEE.

*Primary Examiner* — Esaw T Abraham
(74) *Attorney, Agent, or Firm* — F. Chau & Associates, LLC (57) ABSTRACT

A method for Bose-Chaudhuri-Hocquenghem (BCH) soft error decoding includes receiving a codeword x, wherein the received codeword x has $\tau=t+r$ errors for some $r \geq 1$; computing a minimal monotone basis $\{\lambda_i(x)\}_{1 \leq i \leq r+1} \subseteq F[x]$ of an affine space $V=\{\lambda(x) \in F[x]: \lambda(x) \cdot S(x) = \lambda'(x) \pmod{x^{2r}}, \lambda(0)=1, \deg(\lambda(x)) \leq t+r\}$, wherein $\lambda(x)$ is an error locator polynomial and $S(x)$ is a syndrome; computing a matrix $A \equiv (\lambda_j \beta_i)_{i \in [W], j \in [r+1]}$, wherein $W=\{\beta_i, \ldots, \beta_W\}$ is a set of weak bits in x; constructing a submatrix of r+1 rows from sub matrices of r+1 rows of the subsets of A such that the last column is a linear combination of the other columns; forming a candidate error locating polynomial using coefficients of the minimal monotone basis that result from the constructed submatrix; performing a fast Chien search to verify the candidate error locating polynomial; and flipping channel hard decision at error locations found in the candidate error locating polynomial.

18 Claims, 3 Drawing Sheets

(56) References Cited

U.S. PATENT DOCUMENTS

| | | | |
|---|---|---|---|
| 9,619,327 B2* | 4/2017 | Ha | H03M 13/2909 |
| 10,218,388 B2* | 2/2019 | Lin | H03M 13/2963 |
| 10,439,643 B2* | 10/2019 | Garani | H03M 13/353 |
| 10,439,644 B2* | 10/2019 | Hani | H03M 13/3746 |
| 10,461,777 B2* | 10/2019 | Ilani | H03M 13/1545 |
| 10,523,245 B2* | 12/2019 | Kumar | H03M 13/2942 |
| 10,756,763 B2* | 8/2020 | Ku | H03M 13/157 |

* cited by examiner

BCH FAST SOFT DECODING BEYOND THE (D-1)/2 BOUND

TECHNICAL FIELD

Embodiments of the disclosure are directed to algorithms for deterministically decoding Bose-Chaudhuri-Hocquenghem (BCH) codes with up to r errors beyond the (d−1)/2 hamming distance in error patterns that occur with very high probability, which improve the raw bit error rate (BER) coverage of BCH and soft-BCH (SBCH) codes.

DISCUSSION OF THE RELATED ART

A widely known and broadly used BCH soft decoding scheme due to Chase deterministically decodes BCH codes by randomly flipping weak bits and then performing full hard decision (HD) BCH decoding per flip. Other prior-art fast Chase decoders use partial decoding per iteration, but the decoder covers smaller range of error patterns. The fast Chase of Wu, et al., increased soft decoding capability in comparison to Chase soft decoding, which offered an improvement over the classical HD BCH decoder. However, the prior art algorithms require essentially t+r operations per iteration by processing entire error-locator-polynomial (ELP)-type polynomials, and can decode only when the number of weak bits that are errors ≥r+1.

SUMMARY

Embodiments of the present disclosure provide methods of: (1) finding and proving a dimension bound to the linear space solutions of the (t+r)-key-equations; (2) Reduction of the core processing to a small evaluation set that is linked to an r-size linear basis of the key equations; (3) Vast computational sharing between iterations; and (4) Combinatorial ordering that govern the solution of related linear equations. Embodiments of the present disclosure afford complexity reduction when there are more errors in the set of weak bits. Embodiments of the present disclosure further provide soft decoding capability beyond Wu's algorithm.

Algorithms according to embodiments of the present disclosure use r operations per iteration by passing from an evaluation set of a basis to ELP-type polynomials, can decode when the number of weak bits that are errors ≥r−1, and provide a substantial reduction in complexity as the number of errors in the weak bits increases. A design according to embodiments of the disclosure enables decoding whenever the number of weak bits that are errors ≥r+1 and $$r \cdot \binom{w}{r+1} \leq C,$$

and also whenever the number of weak bits that are errors ≥r−1 and $$c \times n \times \binom{w}{r} \leq C,$$

where w is the number of weak bits, c>0, and C>0 is the complexity budget.

According to an embodiment of the disclosure, there is provided a computer-implemented method of Bose-Chaudhuri-Hocquenghem (BCH) soft error decoding, including receiving a codeword x through a communication channel, wherein the received codeword x has τ=t+r errors for some r≥1, wherein t=(d−1)/2 and d is a minimal distance of a BCH code; computing a minimal monotone basis $\{\lambda_i(x)\}_{1 \leq i \leq r+1} \subseteq F[x]$ of an affine space V={λ(x)∈F[x]:λ(x)·S(x)=λ'(x) (mod $x^{2r}$), λ(0)=1, deg(λ(x))≤t+r}, wherein λ(x) is an error locator polynomial, S(x) is a syndrome, and F[x]=GF(q) wherein q=$2^m$ for m>1; computing a matrix A≡$(\lambda_j(\beta_i))_{i \in [W], j \in [r+1]}$, wherein W={$\beta_1, \ldots, \beta_W$} is a set of weak bits in x; and processing for every subset W'⊆W by retrieving from memory a set W"=R(W'), computing $B_{W''}$ by adding one row to $B_{W''}$ and performing Gaussian elimination operations on $B_{W''}$, wherein R(W') is reliability probabilities of the bits in W'. When a first r' columns of $B_{W''}$ are a transpose of a systematic matrix and deg(λ(x))=t+r', wherein 1≤r'≤r, the method further includes performing computing u(x)=gcd(λ(x), λ'(x)), wherein λ'(x) is a derivative of λ(x); computing λ(Φ\W') and deducting from it $Z_{\lambda(x),\Phi}$ wherein $Z_{\lambda(x),\Phi}$={β∈Φ: λ(β)=0}, when u(x) is a scalar in F*; adding a pair (λ(x), $Z_{\lambda(x),\Phi}$) to set a L of all (r', λ(x), $Z_{\lambda(x),\Phi}$) such that 1≤r'≤r, λ(x)∈V'$_{r'}$, |$Z_{\lambda(x),W}$|≥r'+1, and $Z_{\lambda(x),\Phi}$|=t+r', when |$Z_{\lambda(x),\Phi}$|=t+r'; and outputting the set L.

According to a further embodiment of the disclosure, the one row added to $B_{W''}$ is an arbitrary odd-square polynomial in the codeword x.

According to a further embodiment of the disclosure, the method includes forming the error locating polynomial from coefficients in the set L, and flipping channel hard decisions at error locations found in the received codeword.

According to a further embodiment of the disclosure, λ(x)∈V$_{r'}$ is unique and λ(β)=0 for every β∈W', when the first r' columns of $B_{W''}$ are a transpose of a systematic matrix.

According to a further embodiment of the disclosure, the method includes terminating the processing of W' when deg(u(x))≥1.

According to a further embodiment of the disclosure, the method includes terminating the processing of W' when the first r' columns of $B_{W''}$ are not a transpose of a systematic matrix or deg(λ(x))≠t+r'.

According to a further embodiment of the disclosure, the method includes, before computing u(x)=gcd(λ(x),λ'(x)), computing, for every r≥ρ≥r'+2 and a pair ($W_1$, $\lambda_1(x)$) such that λ(x)∈V'$_\rho$ and $W_1$⊆W with |$W_1$|=ρ+1, wherein $\lambda_1(x)$∈$V_\rho$ is a unique polynomial such that $\lambda_1(W_1)$=0, $\lambda_1'(\beta)$ for every β in $W_1$.

According to a further embodiment of the disclosure, the method includes terminating the processing of $W_1$ when for any β in $W_1$, $\lambda_1'(\beta)$=0.

According to an embodiment of the disclosure, there is provided a non-transitory program storage device readable by a computer, tangibly embodying a program of instructions executed by the computer to perform method steps for a Bose-Chaudhuri-Hocquenghem (BCH) soft error decoding. The method includes receiving a codeword x through a communication channel, wherein the received codeword x has τ=t+r errors for some r≥1, wherein t=(d−1)/2 and d is a minimal distance of a BCH code; computing a minimal monotone basis $\{\lambda_i(x)\}_{1 \leq i \leq r+1} \subseteq F[x]$ of an affine space V={λ(x)∈F[x]: λ(x)·S(x)=λ'(x)(mod $x^{2r}$), λ(0)=1, deg(λ(x))≤t+r}, wherein λ(x) is an error locator polynomial, S(x) is a syndrome, and F[x]=GF(q) wherein q=$2^m$ for m>1; computing a matrix A≡$(\lambda_j(\beta_i))_{i \in [W], j \in [r+1]}$, wherein W={$\beta_1, \ldots, \beta_W$} is a set of weak bits in x; constructing a submatrix of r+1 rows from sub matrices of r+1 rows of the subsets of A such that the last column is a linear combination of the other columns; forming a candidate error locating polynomial using coefficients of the minimal monotone basis that result from the constructed submatrix; performing a fast Chien search wherein the candidate error locating polynomial is verified; and flipping channel hard decision at error locations found in the candidate error locating polynomial and returning the decoded codeword x.

According to a further embodiment of the disclosure, constructing a submatrix of r+1 rows from sub matrices of r+1 rows of the subsets of A such that the last column is a linear combination of the other columns includes processing for every subset $W' \subseteq W$ by retrieving from memory a set $W''=R(W')$, computing $B_{W''}$ by adding one row to $B_{W''}$ and performing Gaussian elimination operations on $B_{W'}$, wherein $R(W')$ is reliability probabilities of the bits in $W'$. When a first r' columns of $B_{W''}$ are a transpose of a systematic matrix and $\deg(\lambda(x))=t+r'$, wherein $1 \leq r' \leq r$, the method includes performing computing $u(x)=\gcd(\lambda(x), \lambda'(x))$, wherein $\lambda'(x)$ is a derivative of $\lambda(x)$; computing $\lambda(\Phi \backslash W')$ and deducting from it $Z_{\lambda(x),\Phi}$ wherein $Z_{\lambda(x),\Phi}=\{\beta \in \Phi: \lambda(\beta)=0\}$, when $u(x)$ is a scalar in $F^*$; adding a pair $(\lambda(x), Z_{\lambda(x),\Phi})$ to set a L of all (r', $\lambda(x)$, $Z_{\lambda(x),\Phi}$) such that $1 \leq r' \leq r$, $\lambda(x) \in V'_{r'}$, $|Z_{\lambda(x),W}| \geq r'+1$, and $|Z_{\lambda(x),\Phi}|=t+r'$, when $|Z_{\lambda(x),\Phi}|=t+r'$; and outputting the set L.

According to an embodiment of the disclosure, there is provided a computer memory-based product, including a memory; and a digital circuit tangibly embodying a program of instructions executed by the computer to perform a method or a Bose-Chaudhuri-Hocquenghem (BCH) soft error decoding.

According to a further embodiment of the disclosure, the memory is at least one of a solid-state drive, a universal flash storage, or a DRAM.

DETAILED DESCRIPTION

Introduction—Part 1

Let $m>1$, $q=2^m$, $F=GF(q)$, d is minimal distance of the BCH code, $t=(d-1)/2$, and $\alpha$ be primitive elements of F. $1<n<2^m$ is the BCH code length and $k=n-2t$ is the code dimension. Consider a BCH code whose evaluation set is $A=\{\alpha^1, \ldots, \alpha^n\}$, and parity check matrix is $H=(\alpha^{i \cdot j}$ such that $1 \leq i \leq 2t$, $1 \leq j \leq n$).

A codeword $X=(x_1, \ldots, x_n) \in GF(2)^n$ was transmitted and a word $Y=(y_1, \ldots, y_n) \in GF(2)^n$ is received. The error word is $e=Y-X=(e_1, \ldots, e_n)$ and $E=\{\alpha^u$ such that $e_u=1\}$ is the set of error locations. The decoder computes a standard BCH syndrome: $[S_0, \ldots, S_{d-2}]^T = H \cdot Y = H \cdot e$, which is a vector in $F^{(d-1)}$. The syndrome polynomial is $$S(x)=\Sigma_{0 \leq i \leq d-2} S_i x^i.$$

The receiver tries at first to decode with the standard Berlekamp-Massey (BM) algorithm combined with a Chien search. If it fails it proceeds with a proposed fast soft decoding according to an embodiment of the disclosure. Failing BM means that the received word has $\tau=t+r$ errors for some $r \geq 1$. The set of errors locations is denoted by $E_0=\{\alpha_1, \ldots, \alpha_\tau\} \subseteq A$, where $E_0$ is unknown to the decoder. The following algorithm succeeds whenever the number of errors is $1 \leq r' \leq r$. Initially the soft decoder observes a set $W \subseteq A$ of weak bits. Typically $w \equiv |W| << n$. The error locator polynomial (ELP) polynomial is defined by:

$$\lambda^*(x)=\Pi_{1 \leq j \leq t+r}(1-x \cdot \alpha_j).$$

Set $E=\{1/\beta: \beta \in E_0\}$. For $\beta \in F$ it holds that $\beta \in E$ iff $\lambda^*(\beta)=0$. The task of the following soft decoding algorithm is to first find $\lambda^*(x)$ and then E. Evoking the BCH key equations, the following affine polynomial space is defined:

$$V=\{\lambda(x) \in F[x] \text{such that } \lambda(x) \cdot S(x)=\lambda'(x) \pmod{x^{d-1}}, \text{ and } \lambda(0)=1, \deg(k(x))/t+r\},$$

and $$U=V+\lambda^*(x).$$

By the above $\lambda^*(x) \in V$, and it has been proved that $\dim(U)=\dim^*(V) \leq r$, and $$U=\{\lambda(x) \in F[x] \text{such that } \lambda(x) \cdot S(x)=\lambda'(x) \pmod{x^{d-1}}, \text{ and } \lambda(0)=0, \deg(\lambda(x)) \leq \tau\}.$$

Note also that $U=V+\lambda(x)$ for every $\lambda(x) \in V$.

When $|E \cap W| \geq r+1$, an algorithms according to an embodiment has complexity $$C(w, r) = O\left(r \cdot \binom{w}{r+1}\right).$$

W can be determined, e.g., by log-likelihood ratios, such that this will be the common case. In fact, the larger $|E \cap W|$ is, the faster the algorithm becomes.

Introduction—Part 2

Following the above notations, set $m \geq 1$, $q=2^m$, $F=GF(q)$, and let $d=2t+1$ be the code minimal distance and $t+r$ ($t \geq r \geq 1$) the maximal number of errors that ensuing algorithm can correct. This section provides an overview of the BCH soft decoding procedure without the details of the ECC and BCH context, without details of the building of the basis to V, and mathematical proofs.

In an embodiment, a false alarm (FA) means any processing, beyond minimal, of a polynomial, checked by the algorithm, which is not the actual ELP. In particular, it includes unnecessarily activating the computationally heavy Chien search. An algorithm according to an embodiment has a built in mechanism that minimizes the usage of Chien search and reduces other verifications when FA emerges. In particular an algorithm according to an embodiment foresees bursts of FAs and detects them with reduced complexity. Such FAs may result from an ELP with multiple errors in the weak bits.

In a standard BCH soft decoding algorithm, called a Chase algorithm, each probe requires a Chien search, performed by $q \times t$ products, while an algorithm according to an embodiment requires O(r) products on average, a massive reduction. The proof of the low expected number of Chien search is based on two BCH probability bounds, known as probability bounds 1 and 2 (PB1, PB2), which state that a false alarm probability is upper bounded by $q^{-1}$, or even $q^{-s}$, with $s>1$ in some cases of interest.

For $N \geq 1$, $b(x)=\Sigma_{0 \leq k < N} b_k x^k \in F[x]$ is called odd-square if for all $0 \leq k < (N-1)/2$: $b_k^2=b_{2k+1}$. In the following overview the main input of an algorithm according to an embodiment is a random odd-square polynomial $b(x) \in F[x]$. This is a generalized form of a syndrome polynomial.

A polynomial B(x) can be transformed into to a binary vector. For example, if $B(x)=1+x+x^3+x^5$, the binary vector is 110101.

Note that a computation of the GCD (greatest common divisor) of two polynomials of degree ≤N with the Euclidean algorithm can be performed with $N^2$ products.

A theoretical justification of the algorithms presented below is provided in the Appendix that follows this Detailed Description.

Input

In this general setting the input of the algorithm is:

(1) $b(x) \in F[x]$, an arbitrary odd-square polynomial—this is the binary codeword;

(2) integers (t, r, n, m) where $2^m > n > t \geq r \geq 1$, $n > w \geq r+1$ and $F = GF(2^m)$;

(3) sets $W \subseteq \Phi \subseteq F^*$ wherein $F^*$ is a finite field, such that $n = |\Phi|$ and $w = |W|$.

Here $\Phi$ stands for the evaluation set of the code, which is an auxiliary calculation that assists in the decoding, and W for the weak bits as explained below. The weak bits are those for which the probability of being correct is low.

Setting, Notations, Processing Principle, and Running Memory

For $0 \leq r' \leq r$ define:

$$V_{r'} \equiv V_{2t, t+r', b(x)} \equiv \{\lambda(x) \in F[x] : \lambda(x) \cdot b(x) = \lambda'(x) \pmod{x^{2t}}, \deg(\lambda(x)) \leq t+r', \lambda(0)=1\},$$

$$V'_{r'} = \{\lambda(x) \in F[x] : \lambda(x) \cdot b(x) = \lambda'(x) \pmod{x^{2t}}, \deg(\lambda(x)) = t+r', \lambda(0)=1\},$$

$$V \equiv V_r,$$

and write $W = \{\beta_1, \ldots, \beta_W\}$, where the $\beta_i$ are the probabilities and indices of the weak bits.

Note that it can be assumed without loss of generality that $\dim(V) = r$. ◊

For every $\lambda(x) \in F[x]$ and a set $U \subseteq F$, define $$\lambda(U) = \{\lambda(\beta) : \beta \in U\},$$

$$Z_{\lambda(x),U} = \{\beta \in U : \lambda(\beta) = 0\}. \diamond$$

Take $1 \leq r' \leq r$. Note that by the uniqueness lemma, if $\lambda(x) \in V_{r'}$ is separable, and for $Z \subseteq F$, $|Z| \geq r'$, Z is a zero set for $\lambda(x)$, i.e., $\lambda(Z) = \{0\}$, then $\lambda(x)$ is the only polynomial in $V_{r'}$ for which Z is a zero set. ◊

Definition. For $Q \subseteq W$ define $Q^* = \{i \in [w] : \beta_i \in Q\}$.

Define $$A \equiv (\lambda_j(\beta_i))_{i \in [w], j \in [r+1]},$$

and for $Q \subseteq W$ define $A_Q$ to be the matrix obtained from A by omitting all rows that are not in $Q^*$ and $B_Q$ is the unique reduced row echelon (RRE) matrix, also referred to as a semi systematic matrix, whose row space is equal to the row space of $A_Q$. ◊

A matrix B is called systematic if $B = [I, C]$, i.e., B is the concatenation of I and C into one matrix, where I the unit matrix. ◊

Set ordering and the processing principle.

The subsets of W are ordered by a total order, <, typically lexicographic, e.g. a depth first order, wherein for any $W_1$ and $W_2$, subsets of W such that $|W_i| \leq r+1$, if $W_1 < W_2$ then $W_1$ is processed before $W_2$. There is a mapping R such that for every $W' \subseteq W$, $1 \leq |W'| \leq r+1$ there is $W'' = R(W') \subseteq W'$, which is unique, with $|W''| = |W'| - 1$, such that the following holds:

(1) Running memory. For every $W' \subseteq W$ and $j \equiv |W'| \leq r+1$, the running memory stored before W' is processed, contains $\{B_{W'(i)} : i \in [j]\}$ where $\emptyset = W(0) < W'(1) < W'(2) < \ldots < W'(j) = W'$ and for $i \in [j]$: $|W'(i)| = i$, and $R(W(i)) = W(i-1)$, which implies that the running memory is very small.

(2) Computation sharing. For every $W' \subseteq W$ with $|W'| \leftarrow r+1$, when W' is processed the decoder computes at first $B_{W''}$. It is performed after retrieving from memory the matrix $B_{R(W')}$, and then performing a minimal amount of delta Gaussian elimination operations to compute $B_{W''}$. It takes an average of O(r) products per W'.

Output

An algorithm according to an embodiment is a list decoder, which is a decoder whose output a list of codewords. One codeword in the list is the original valid codeword. The output is the set L, which is an array of codewords, of all (r', $\lambda(x)$, $Z_{\lambda(x),\Phi}$) such that:

$$1 \leq r' \leq r, \lambda(x) \in V'_{r'}, |Z_{\lambda(x),W}| \geq r'+1, \text{ and } |Z_{\lambda(x),\Phi}| = t+r'.$$

Steps

Figure 1:
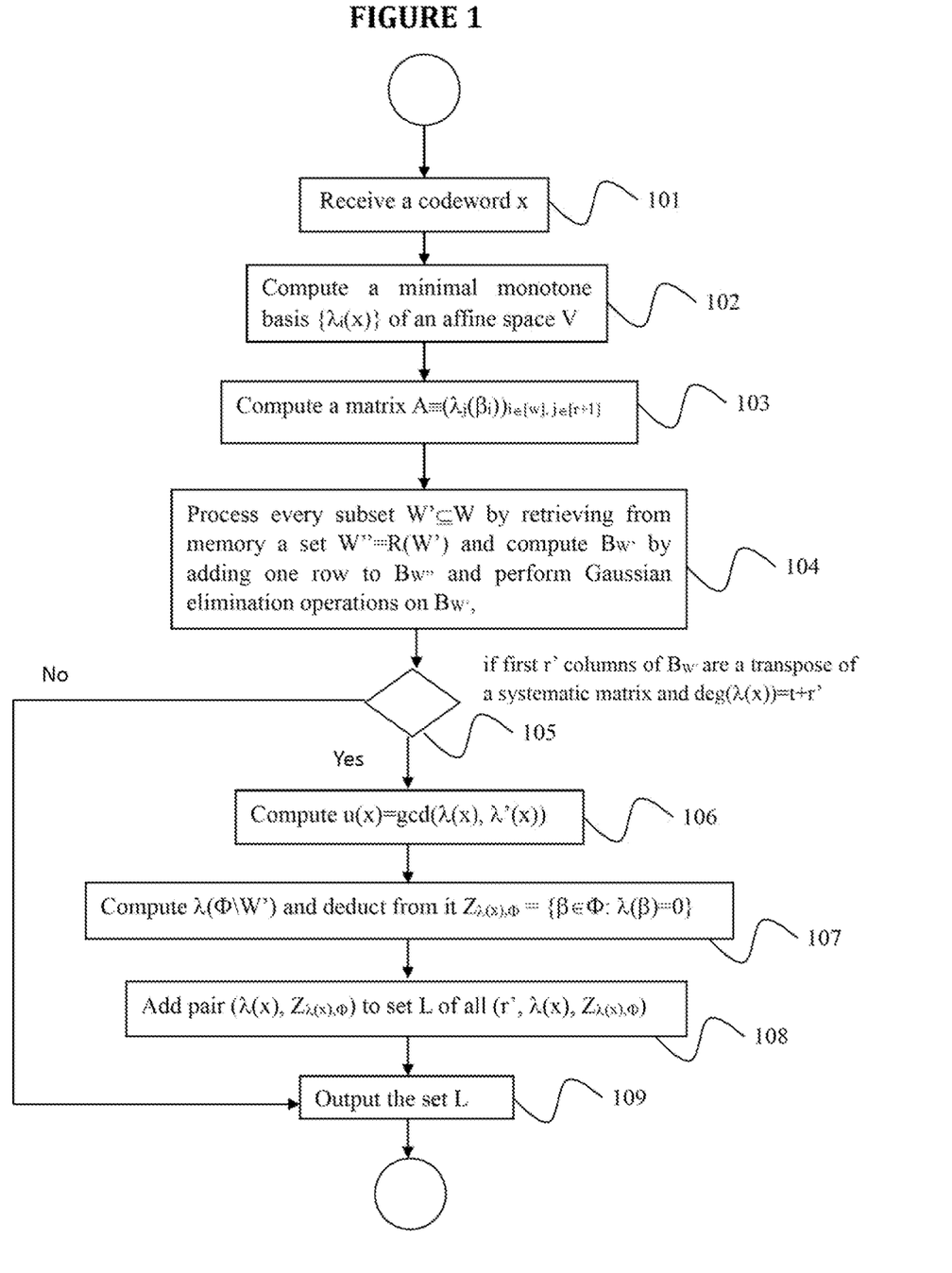
FIG. 1 is a flow chart of an error decoding algorithm according to an embodiment of the disclosure.

FIG. 1 is a flowchart of an error decoding algorithm according to an embodiment of the disclosure. Referring now to the figure, an algorithm according to an embodiment begins at step 101 by receiving a codeword x.

An algorithm according to an embodiment computes first, at step 102, a minimal monotone basis of V: $\{\lambda_i(x)\}_{1 \leq i \leq r+1} \subseteq F[x]$, and then, at step 103, computes the matrix A defined above, and computes also:

$$\{\lambda_j(\beta) : \beta \in \Phi \backslash W, j \in [r+1]\}.$$

Methods for computing the minimal monotone basis of V and the matrix A are known in the art.

(ii) At step 104, an algorithm according to an embodiment goes through every set $W' \subseteq W$, with $|W'| \leq r+1$, in accordance with the order <. When $W' \subseteq W$, with $r'+1 \equiv |W'| \leq r+1$, is processed the decoder retrieves from the running memory $W'' = R(W')$, which is read data and reliability probabilities, and computes a basis $B_{W'}$ by adding the polynomial vector b(x) as one row to $B_{W''}$ and performing a minimal number of Gaussian elimination operations to yield a set of codewords. If, at step 105, the first r' columns of $B_{W'}$ are a transpose of a systematic matrix, there is an instant check that tells the decoder if there exists a unique $\lambda(x) \in V_{r'}$ such that $\lambda(\beta) = 0$ for every $\beta \in W'$. If the answer is positive and, $\deg(\lambda(x)) = t+r'$, the following steps take place, otherwise the processing of W' ends at step 109, where the set L is output.

(s1) At step 106, apply the Euclidean algorithm to compute $u(x) = \gcd(\lambda(x), \lambda'(x))$.

(s2) At step 107, if u(x) is a scalar in $F^*$ (i.e., $\lambda(x)$ is separable) compute $\lambda(\Phi \backslash W')$ (i.e. Chien search) and deduct from it $Z_{\lambda(x),\Phi}$, otherwise if $\deg(u(x)) \geq 1$ the processing of W' ends at step 109.

(s3) At step 108, if u(x) is a scalar and $|Z_{\lambda(x),\Phi}| = t+r'$, the pair $(\lambda(x), Z_{\lambda(x),\Phi})$ is added to L.

As mentioned above, this processing requires O(r) products on average instead of the standard $O(r^3)$ in a prior art scheme.

Comments and Further Reduction of False Alarm In Some Distinct Cases (1) Following (i), in an algorithm according to an embodiment, the computation of $\lambda(U)$ for $\lambda(x) \in V_{r'}$ and a subset $U \subseteq F$, e.g. Chien search when $U = \Phi$, is done in a fast mode that requires r' products for each $\beta$, instead of t+r' in the standard method. This is due to the fact that $\lambda(x) - \lambda_{r+1}(x)$ is a linear combination of $\{\lambda_i(x)\}_{1 \leq i \leq r} \subseteq F[x]$.

(2) It follows from the Probability Bound 2 (PB2), described in the appendix below, that in BCH decoding, for $W' \subseteq W$, with $|W'| = r'+s$ ($s \geq 1$) the probability that there exists $\lambda(x) \in V'_{r'}$ which is not the ELP such that $\lambda(W') = \{0\}$, is upper bounded by $q^{-s}/(1-q^{-2})$. Observe that if s=1, then no product of $\lambda(x)$ will appear again in the algorithm.

(3) Suppose that s=a+1, where a≥1 and r≥r'+a+1=r'+s and there exists $W' \subseteq W$ with |W'|=r'+s, and a separable $\lambda(x) \in V'_{r'}$, such that $\lambda(W')=\{0\}$. Such event can be portrayed as an event of an overflow of zeros within W per a polynomial in V, in comparison to its degree.

(4) It follows from the supposition in (3) that for every 1≤b≤a such that: r'+2b≤r and r'+1+a+b≤w, take any mutually different $\beta_1, \ldots, \beta_b \in W \backslash W'$, and define:

$$\lambda_1(x)=(1-\beta_1 \cdot x)^2 \cdot \ldots \cdot (1-\beta_a \cdot x)^2 \cdot \lambda(x) \text{ and}$$
$$W_1 = W' \cup \{\beta_1, \ldots, \beta_a\}.$$

It holds that $\lambda_1(x)$ might be processed, unnecessarily, by an above algorithm according to an embodiment as part of the handling of the subset $W_1$. The likelihood of this unwanted occurrence follows from the fact that:

$$\deg(\lambda_1(x))=t+r'+2b, W_1 \subseteq W, |W_1|=r'+a+b+1, a \geq b, \text{ and}$$
$$\lambda_1(W_1)=\{0\}.$$

While the incidence of (3) is very rare in the case that $\lambda(x)$ is not an ELP, (see (2) above), it can occur sometimes when $\lambda(x)$ is ELP. It depends on the input of the algorithm. When (3) occurs, for some $\lambda(x) \in V'_{r'}$, in an embodiment, the decoder performs the following preliminary step, (s0), prior to (s1) under the following condition with respect to the minimal r' that satisfies (3):

(s0) For every r≥ρ≥r'+2 and a pair ($W_1$, $\lambda_1(x)$) such that $\lambda(x) \in V'_\rho$ and $W_1 \subseteq W$ with $|W_1|=\rho+1$, wherein $\lambda_1(x) \in V_\rho$ is the unique polynomial such that $\lambda_1(W_1)=0$, the decoder computes $\lambda_1'(\beta)$ for every $\beta$ in $W_1$, and if for any $\beta$ in $W_1$, $\lambda_1'(\beta)=0$, the processor ends the processing of $W_1$. ◊

Observe that if $\lambda_1'(\beta)=0$ for some $\beta$ in $W_1$ then $\lambda_1(x)$ is not separable. Note also that the computation of $\lambda_1'(\beta)$ requires only (t+φ/2 products.

Overview

Figure 2:
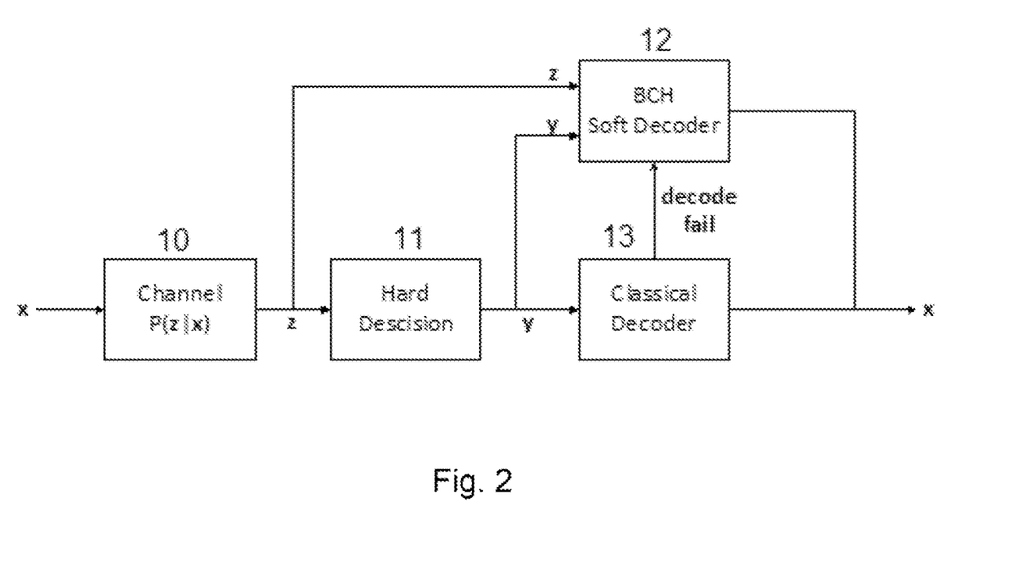
FIG. 2 is a block diagram of a new architecture for implementing an error decoding algorithm, according to an embodiment of the disclosure.

A decoding system according to an embodiment is shown in FIG. 2. According to an embodiment, denote by $x=\{x_i\}_{i=1}^n$ the (n, k, d) BCH code word, where $x_i \in GF(2)$, k is the code dimension, n is the code length and d is the BCH code minimal distance. The codeword is transmitted through a channel 10 with independent and identically distributed transition probability P(z|x), where $z \in \mathcal{R}$ and $x \in GF(2)$. The hard decision decoder 11 receives the channel output and decodes a codeword $\hat{x}$. Denote the log likelihood ratio of symbol i given the channel value $z_i$ as $$R_i = \log\left(\frac{P(z_i \mid x = 0)}{P(z_i \mid x = 1)}\right),$$

and y as the channel hard decision, where $$y_i = \begin{cases} 0 & LLR_i \geq 0 \\ 1 & o.w. \end{cases}.$$

A classic BCH decoder 12 is applied to y. If $|\{j|x_j \neq y_j \text{ for } 1 \leq i \leq n\}|>t$, where $$t = \left\lfloor \frac{d-1}{2} \right\rfloor,$$

the classic BCH decoder fails and a BCH soft decoder 13 according to an embodiment is applied.

According to an embodiment, an overview of a BCH soft decoder algorithm is as follows.

Input: z, y
Output: $\hat{x}$

1. Find a set of w weak bits locations (lowest likelihood ratio):

$$W=\{\beta_i\}_{1 \leq i \leq w}, \beta_i=\alpha^{j_i}, j_i \in [0, n-1].$$

2. Solution to t+r key equation forms an r dimensional affine space.
Find a monotone affine basis: $\Lambda=\{\lambda_1(x) \ldots \lambda_{r+1}(x)\}$.
In high probability, the ELP is given as affine combination of this basis:

$$\lambda(x)=b_1 \cdot \lambda_1(x)+b_2 \cdot \lambda_2(x)+ \ldots b_r \cdot \lambda_r(x)+\lambda_{r+1}(x).$$

3. Look efficiently for r+1 from w locations that zero the ELP polynomial with some coefficients $\{b_i\}_{1 \leq i \leq r}$:
   a. Compute the solution matrix:

$$A = \{a_{ij} = \lambda_j(\beta_i)\}_{1 \leq i \leq w, 1 \leq j \leq r+1} = \begin{bmatrix} a_{1,1} & \cdots & a_{1,r+1} \\ \vdots & \ddots & \vdots \\ a_{w,1} & \cdots & a_{w,r+1} \end{bmatrix}$$

b. Go over all combination of sub matrices of r+1 rows of the subsets of A, to find submatrix of r+1 rows such that the last column is a linear combination of the other columns. This part receives the coefficients of the affine base b and r+1 error locations.
   This is the main part of the algorithm and it is described in detail above in steps (ii), s1, s2 and s3.
   Computation sharing reduces the complexity of each check from $O(r^3)$ to $O(r)$.
   c. Form the candidate ELP using the resulting coefficients.
4. Fast Chien search to verify the candidate ELP and error locations.
5. Flip the channel hard decision at the error locations found in step 3 and return the decoded word $\hat{x}$.

System Implementations

It is to be understood that embodiments of the present disclosure can be implemented in various forms of hardware, software, firmware, special purpose processes, or a combination thereof. In one embodiment, the present disclosure can be implemented in hardware as an application-specific integrated circuit (ASIC), or as a field programmable gate array (FPGA). In another embodiment, the present disclosure can be implemented in software as an application program tangible embodied on a computer readable program storage device. The application program can be uploaded to, and executed by, a machine comprising any suitable architecture.

In addition, methods and implementations of embodiments of the disclosure can be used or incorporated into any memory-based product, such as a solid-state drive (SSD), universal flash storage (UFS) products, DRAM modules, etc.

Figure 3:
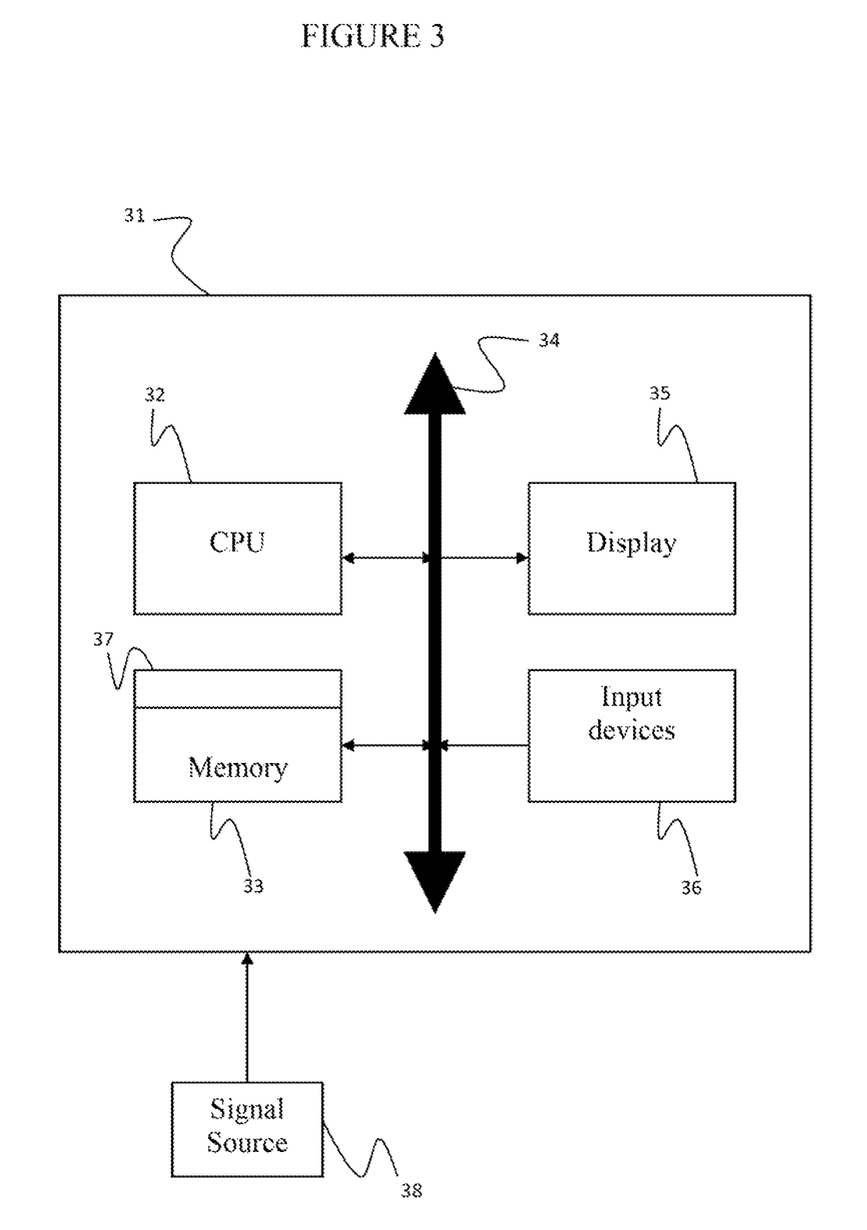
FIG. 3 is a block diagram of a system for implementing a new architecture for an error decoding algorithm according to an embodiment of the disclosure.

FIG. 3 is a block diagram of a system for implementing an erasure correction algorithm that uses a neural network to perform matrix inversion, according to an embodiment of the disclosure. Referring now to FIG. 3, a computer system 31 for implementing the present disclosure can comprise, inter alia, a central processing unit (CPU) or controller 32, a memory 33 and an input/output (I/O) interface 34. The computer system 31 is generally coupled through the I/O interface 34 to a display 35 and various input devices 36 such as a mouse and a keyboard. The support circuits can include circuits such as cache, power supplies, clock circuits, and a communication bus. The memory 33 can include random access memory (RAM), read only memory (ROM), disk drive, tape drive, etc., or a combinations thereof. The present disclosure can be implemented as a routine 37 that is stored in memory 33 and executed by the CPU or controller 32 to process the signal from the signal source 38. As such, the computer system 31 is a general purpose computer system that becomes a specific purpose computer system when executing the routine 37 of the present disclosure. Alternatively, as described above, embodiments of the present disclosure can be implemented as an ASIC or FPGA 37 that is in signal communication with the CPU or controller 32 to process the signal from the signal source 38.

The computer system 31 also includes an operating system and micro instruction code. The various processes and functions described herein can either be part of the micro instruction code or part of the application program (or combination thereof) which is executed via the operating system. In addition, various other peripheral devices can be connected to the computer platform such as an additional data storage device and a printing device.

It is to be further understood that, because some of the constituent system components and method steps depicted in the accompanying figures can be implemented in software, the actual connections between the systems components (or the process steps) may differ depending upon the manner in which the present disclosure is programmed. Given the teachings of the present disclosure provided herein, one of ordinary skill in the related art will be able to contemplate these and similar implementations or configurations of the present disclosure.

While the present disclosure has been described in detail with reference to exemplary embodiments, those skilled in the art will appreciate that various modifications and substitutions can be made thereto without departing from the spirit and scope of the disclosure as set forth in the appended claims.

APPENDIX

1. Analysis of the BCH Key Equations I: Beyond the (D−1)/2 Radius, and the Dimension Equality 1.1 Introduction Here $F=GF(2^m)$, $m>1$ and the empty sum is zero.

Definition 1:

(i) For an n dimensional vector space V over F and subspace $U \subseteq V$, and $v \in V$ we define the dimension of the affine space $v+U$ to be n, and write:

$$\dim^*_F(v+U)=n.$$

(ii) For $L \geq N \geq 1$, and $b(x)=\Sigma_{0 \leq k < N} b_k x^k$, $c(x)=\Sigma_{0 \leq k < L} c_k x^k \in F[x]$ we would denote $b(x) \leq c(x)$ if for all $0 \leq k < N$ it holds that $c_k = b_k$.

Lemma 1. Take $\lambda(x) \in F[x]$, where $\lambda(0)=1$. Let K be an extension field of F that contains all $\lambda(x)$ roots. Represent $\lambda(x)$ by: $\lambda(x)=\Pi_{1 \leq j \leq s}(1-x \cdot \alpha_j)^{r(j)}$ where $\alpha_1, \ldots, \alpha_s \in K^*$ are mutually different and $r(j) \geq 1$. Then the following equality holds:

$$\lambda'(x)/\lambda(x)=\Sigma_{1 \leq j \leq s, r(j) \text{ is odd}} \alpha_j/(1-x \cdot \alpha_j).$$

Proof. We can write $\lambda(x)=\beta^2(x) \cdot \Pi_{1 \leq j \leq s, r(j) \text{ is odd}}(1-x \cdot \alpha_j)$ where $\beta(x) \in K[x]$. In other words, every polynomial can be represented uniquely as a product of a square polynomial and a polynomial with roots of multiplicity 1. It then holds that $$\lambda'(x)/\lambda(x)=\Sigma_{1 \leq j \leq s \; r(j) \text{ is odd}} \alpha_j \cdot \Pi_{1 \leq v \leq s, r(v) \text{ is odd}, v \neq j}(1-x \cdot \alpha_v),$$

and hence:

$$\lambda'(x)/\lambda(x)=\Sigma_{1 \leq j \leq s, r(j) \text{ is odd}} \alpha_j/(1-x \cdot \alpha_j). \blacklozenge$$

Lemma 2. Take $\lambda(x) \in F[x]$ with $\lambda(0)=1$, and $b(x)=\Sigma_{0 \leq j \leq N-1} b_j x^j \in F[x]$. Let K be an extension field of F that contains all $\lambda(x)$ roots. Represent $\lambda(x)$ by: $\lambda(x)=\Pi_{1 \leq j \leq s}(1-x \cdot \alpha_j)^{r(j)}$ where $\alpha_1, \ldots, \alpha_s \in K^*$ are mutually different and $r(j) \geq 1$. Then $$\lambda(x) \cdot b(x) = \lambda'(x) \pmod{x^N} \text{ iff} \quad (1)$$

$$b_k = \Sigma_{1 \leq j \leq s, r(j) \text{ is odd}} \alpha_j^{k+1} \text{ for all } 0 \leq k \leq N-1. \blacklozenge \quad (2)$$

Note that here we do not assume anything on the degrees of $\lambda(x)$ and $b(x)$, not even $s \leq N$. Thus it holds even when $b(x)=0$. Note also that when (2) holds then for $0 \leq k < (N-1)/2$: $b_k^2 = b_{2k+1}$.

Proof. Since $\lambda(0)=1$, $\lambda(x) \cdot b(x) = \lambda'(x) \pmod{x^N}$ is equivalent to $b(x) = \lambda'(x)/\lambda(x) \pmod{x^N}$ which is equivalent to:

$$\Sigma_{0 \leq k < N} b_k x^k = \lambda'(x)/\lambda(x) \text{(by lemma1)} = \Sigma_{1 \leq j \leq s, r(j) \text{ is odd}} \alpha_j/(1-x \cdot \alpha_j) \pmod{x^N} = \Sigma_{1 \leq j \leq s, r(j) \text{ is odd}} \Sigma_{0 \leq k} x^k \cdot \alpha_j^{k+1} \pmod{x^N} = \Sigma_{0 \leq k \leq N-1} x^k \cdot \Sigma_{1 \leq k \leq s, r(j) \text{ is odd}} \alpha_j^{k+1} \pmod{x^N},$$

and this is equivalent to $b_k = \Sigma_{1 \leq j \leq s, r(j) \text{ is odd}} \alpha_j^{k+1}$ for all $0 \leq k \leq N-1$. $\blacklozenge$ The following lemma enables us to skip the even iterations in the BCH Berlekamp Massey algorithm.

Lemma 3. Let $\lambda(x) \in F[x]$, $\lambda(0)=1$. Suppose that N is odd and $M=(N-1)/2$ and that $b(x)=\Sigma_{0 \leq k \leq N} b_k x^k$, satisfies $b_M^2 = b_N$ and $$\lambda(x) \cdot b(x) = \lambda'(x) \pmod{x^N}.$$

It then holds that the coefficient of $x^N$ in $\lambda(x) \cdot b(x)$ is zero and $$\lambda(x) \cdot b(x) = \lambda'(x) \pmod{x^{N+1}}$$

Proof. Let K be an extension field of F that contains all $\lambda(x)$ roots. Represent $\lambda(x)$ by: $\lambda(x)=\Pi_{1 \leq j \leq s}(1-x \cdot \alpha_j)^{r(j)}$ where $\alpha_1, \ldots, \alpha_s \in K^*$ are mutually different and $r(j) \geq 1$. By lemma 2

$$b_k = \Sigma_{1 \leq j \leq s, r(j) \text{ is odd}} \alpha_j^{k+1} \text{ for all } 0 \leq k \leq N-1.$$

In addition, $$b_N = b_M^2 = (\Sigma_{1 \leq j \leq s, r(j) \text{ is odd}} \alpha_j^{M+1})^2 = \Sigma_{1 \leq j \leq s, r(j) \text{ is odd}} \alpha_j^{2M+2} = \Sigma_{1 \leq j \leq s, r(j) \text{ is odd}} \alpha_j^{N+1}$$

It follows that $b_k = \Sigma_{1 \leq j \leq s, r(j) \text{ is odd}} \alpha_j^{k+1}$ for all $0 \leq k \leq N$. Thus by the other direction of lemma 2: $\lambda(x) \cdot b(x) = \lambda'(x) \pmod{x^{N+1}}$. Since all the odd coefficients of $\lambda'(x)$ are zero, the coefficients of $x^N$ in $\lambda'(x)$ is zero and hence the coefficients of $x^N$ in $\lambda(x) \cdot b(x)$ is zero. $\blacklozenge$ 1.2 Definitions Definition 2. For $N \geq 1$, and $b(x)=\Sigma_{0 \leq k < N} b_k x^k \in F[x]$, $b(x)$ is odd-square if for all $0 \leq k < (N-1)/2$: $b_k^2 = b_{2k+1}$.

Definition 3. For $\tau$, N, L, $\geq 1$, and $b(x)=\Sigma_{0 \leq k \leq L} b_k x^k \in F[x]$, define $$V_{N,\tau,b(x)} = \{\lambda(x) \in F[x]: \lambda(x) \cdot b(x) = \lambda'(x) \pmod{x^N}, \deg(\lambda(x)) \leq \tau, \lambda(0)=1\}$$

$$U_{N,\tau,b(x)} = \{\lambda(x) \in F[x]: \lambda(x) \cdot b(x) = \lambda'(x) \pmod{x^N}, \deg(\lambda(x)) \leq \tau\}$$

$$V_{N,\tau,b(x),0} = \{\lambda(x) \in F[x]: \lambda(x) \cdot b(x) = \lambda'(x) \pmod{x^N}, \deg(\lambda(x)) \leq \tau, \lambda(0)=0\}$$

$$U_{N,b(x)} = \{\lambda(x) \in F[x]: \lambda(x) \cdot b(x) = \lambda'(x) \pmod{x^N}\}$$

It is clear that either $V_{N,\tau,b(x)} = \emptyset$ or $\dim^*(V_{N,\tau,b(x)}) = \dim(U_{N,\tau,b(x)}) - 1$. By the above lemma that if $V_{N,\tau,b(x)} \neq \emptyset$ for some $\tau$ and $L \leq N$ then $b(x)$ is odd-square. Note that if $V_{N,\tau,b(x)}$ is not empty and $\lambda(x)$ is any element of $V_{N,\tau,b(x)}$ then $$\lambda(x) + V_{N,\tau,b(x),0} = V_{N,\tau,b(x)}$$

which implies that when $V_{N,\tau,b(x)} \neq \emptyset$, $$\dim^*(V_{N,\tau,b(x)}) = \dim(V_{N,\tau,b(x),0}).$$

1.3 The Dimension Bound 1 & 2

Lemma 4(Dimension Bound 1). Let $\tau \geq 1$ and $L > N \geq 1$ where N and L are even and $b(x) \in F[x]$ is odd-square, $b(x) = \Sigma_{0 \leq k < L} b_k x^k$. Then, if $V_{L,\tau,b(x)} \neq \emptyset$, $$\dim^*(V_{N,\tau,b(x)}) - \dim^*(V_{L,\tau,b(x)}) \leq (L-N)/2.$$

Proof. For $M \geq 1$ set $V_M = V_{M,\tau,b(x)}$. It will be shown by induction on even $s \in \{0, 1, \ldots, L-N\}$ that $$\dim^*(V_N) - \dim^*(V_{N+s}) \leq s/2.$$

For $s=0$: take even $0 \leq s < L-N$, and $M=N+s$ and $\lambda(x) \in V_M$ and observe that the M coefficient of $p(x) = \lambda(x) \cdot b(x) - \lambda'(x)$ is $$\Sigma_{0 \leq j \leq \tau} \lambda_j \cdot b_{M-j} + \lambda_{M+1}.$$

Thus $V_{M+1} = \{\lambda(x) \in V_M : \lambda_{M+1} + \Sigma_{0 \leq j \leq \tau} \lambda_j \cdot b_{N-j} = 0\}$, i.e. $V_{M+1}$ is (nonempty) affine space which is obtained from $V_M$ by one additional linear homogeneous equation. It follows that $\dim^*(V_M) \leq \dim^*(V_{M+1}) + 1$. Next, by the previous lemma when $\lambda(x) \cdot b(x) = \lambda'(x) \pmod{x^{M+1}}$ then $$\lambda(x) \cdot b(x) = \lambda'(x) \pmod{x^{M+2}}.$$

And hence $V_{M+1} = V_{M+2}$. Thus shown that $\dim^*(V_{N+s}) \leq \dim^*(V_{N+s+2}) + 1$ ◆

As a corollary we get that:

Lemma 5 (Dimension Bound 2). Take $\tau \geq 1$, $L = 2\tau$, and $L \geq N \geq 1$ where N is even, and $b(x) \in F[x]$ is odd-square, $b(x) = \Sigma_{0 \leq k < L} b_k x^k$. If there exists a separable $\sigma(x) \in V_{L,\tau,b(x)}$ such that $\deg(\sigma(x)) = \tau$, then:

$$\dim^*(V_{N,\tau,b(x)}) \leq (L-N)/2.$$

Proof. This lemma follows from the previous lemma and from a claim that $$(*) V = V_{L,\tau,b(x)} = \{\sigma(x)\}, \text{i.e. } \dim^*(V_{L,\tau,b(x)}) = 0.$$

To prove (*) take any $\lambda(x) \in V$ and let K be an extension field of F that contains all the roots of $\sigma(x)$ and $\lambda(x)$. We can then represent $$\lambda(x) = \Pi_{1 \leq j \leq s}(1 - x \cdot \alpha_j)^{r(j)}$$

where $s \leq \tau$ and $\alpha_1, \ldots, \alpha_s \in K^*$ are mutually different and $r(j) \geq 1$ and $r(1) + r(2) + \ldots + r(s) \leq \tau$, and, $$\sigma(x) = \Pi_{1 \leq j \leq r}(1 - x \cdot \beta_j)$$

where $\beta_1, \ldots, \beta_r \in K^*$ are mutually different. Define A to be the symmetric difference of $\{\beta_1, \ldots, \beta_\tau\}$ and $\{\alpha_j : j \in [s], r(j)$ is odd$\}$ [the symmetric difference of two sets is the set of elements which is one of the sets and not in their intersection]. By lemma 2:

$$\Sigma_{1 \leq j \leq r} \beta_j^{k+1} = b_k = \Sigma_{1 \leq j \leq s, r(j) \text{ is odd}} \alpha_j^{k+1} \text{ for all } 0 \leq k \leq -1.$$

That is:

$$0 = \Sigma_{1 \leq j \leq r} \beta_j^{k+1} + \Sigma_{1 \leq j \leq s, r(j) \text{ is odd}} \alpha_j^{k+1} = E_{\alpha \in A} \alpha^{k+1} \text{ for all } 0 \leq k \leq -1.$$

Note that $|A| \leq s + \tau \leq 2\tau$, thus if $A \neq \emptyset$ we get a contradiction since this yields a linear dependency of the columns of a $(2\tau) \times |A|$ Vandermonde matrix. Therefore $A = \emptyset$ and hence $\lambda(x) = \sigma(x)$ ◆

1.4 Uniqueness Lemma 1 (UL1)

Note that the following lemma uses the fact that F has characteristic 2.

Lemma 6:

I. For every $\lambda(x) \in F[x]$ such that $\lambda(0) = 1$. There then exists exist unique polynomials $\lambda_1(x), u(x) \in F[x]$, such that:

$$\lambda_1(x) \cdot u^2(x) = \lambda(x) \text{ and } \lambda_1(0) = u(0) = 1 \text{ and } \lambda_1(x) \text{ is separable.}$$

II. Suppose that $\lambda(x)$, $b(x) \in F[x]$ satisfy:

$$\lambda(x) \cdot b(x) = \lambda'(x) \pmod{x^N} \text{ and with } \lambda(0) = 1,$$

and let $\lambda_1(x), u(x) \in F[x]$, be the unique polynomials $\lambda_1(x), u(x) \in F[x]$, such that:

$$\lambda_1(x) \cdot u^2(x) = \lambda(x) \text{ and } \lambda_1(0) = u(0) = 1 \text{ and } \lambda_1(x) \text{ is separable,}$$

then $$\lambda_1(x) \cdot b(x) = \lambda_1'(x) \pmod{x^N} \text{ and } \lambda(0) = 1.$$

III. Take $\tau$; $N \geq 1$, and $b(x) \in F[x]$, and suppose that there is a unique $\lambda(x) \in F[x]$ such that:

$$\lambda(x) \cdot b(x) = \lambda'(x) \pmod{x^N} \text{ and } \lambda(0) = 1 \text{ and } \deg(\lambda(x)) \leq \tau.$$

Then $\lambda(x)$ is separable.

Proof.

I. There exist unique $\lambda_1(x), u(x) \in K[x]$, in some extension field K, such that:

$$\lambda_1(x) \cdot u^2(x) = \lambda(x) \text{ and } \lambda_1(0) = u(0) = 1.$$

Since $u^2(x) = \gcd(\lambda(x), \lambda'(x))$ and the gcd is computed by the Euclidean algorithm, then $u^2(x) \in F[x]$ and hence $\lambda_1(x)$ and $u(x)$ must be in $F[x]$ (and not only in the extension ring $K[x]$).

II. It follows from the assumptions of II that:

$$\lambda_1(x) \cdot u^2(x) \cdot b(x) = (u^2(x) \cdot \lambda_1(x))' \pmod{x^N} = u^2(x) \cdot \lambda_1'(x) \pmod{x^N}.$$

Dividing both sides by $u^2(x)$, we get that:

$$\lambda_1(x) \cdot b(x) = \lambda_1'(x) \pmod{x^N}.$$

III., Let $\lambda_1(x), u(x) \in F[x]$, be the unique polynomials $\lambda_1(x), u(x) \in F[x]$, such that:

$$\lambda_1(x) \cdot u^2(x) = \lambda(x) \text{ and } \lambda_1(0) = u(0) = 1 \text{ and } \lambda_1(x) \text{ is separable.}$$

Then by II $$\lambda_1(x) \cdot b(x) = \lambda_1'(x) \pmod{x^N} \text{ and } \lambda(0) = 1, \text{ and clearly: } \deg(\lambda_1(x)) \leq \tau,$$

and hence by the uniqueness $u(x) = 1$ and thus $\lambda_1(x) = \lambda(x)$. It follows that $\lambda(x)$ is separable ◆

1.5 A Fundamental Rule of Nonhomogeneous Linear Equations

For completeness sake the following known fact is presented.

Fact. Let A be $M \times (N+1)$ matrix over a field K (a general field with any characteristic), and B the $(M+1) \times N$ matrix over K obtained from A by adding one additional row, called v, at the bottom of A. If for every $x \in R = \{x = [x_1, \ldots, X_N, X_{N+1}]^T \in K^{N+1} : x_{N+1} = 1\}$ it holds that $$\emptyset \neq V = \{x \in R : A \cdot x = 0\} = \{x \in R : B \cdot x = 0\} \equiv V',$$

then v is in the row space of A.
Proof. Let $$U = \{x = [x_1, \ldots, x_N, x_{N+1}]^T \in K^{N+1} : x_{N+1} = 0, A \cdot x = 0\} \text{ (the set of solutions to homogeneous equations)}$$

$$U' = \{x = [x_1, \ldots, x_N, x_{N+1}]^T \in K^{N+1} : x_{N+1} = 0, B \cdot x = 0\},$$

$C^*$ the matrix obtained from the matrix C by omission of the last column (including the case where C comprises one row).
Since $\emptyset \neq V' = V$ then $U' = U$. It follows that $v^* = u \cdot A^*$ for some u, a row vector in $K^M$. Put $w = v - u \cdot A$, then $$w = [0, \ldots, 0, \xi] \text{ for some } \xi \in K,$$

and w is in the row space of B, and hence for all $x \in V'$: $w \cdot x = 0$, thus $w = 0$, which implies that v is in the row space of A. ◆

1.6 The Dimension Equality
Lemma 7 (The Dimension Equality) Take $\tau \geq 1$, $L = 2\tau$, and $L \geq N \geq 1$ where N is even, and $b(x) = \sum_{0 \leq k < L} b_k x^k \in F[x]$ is odd-square. If there exists a separable $\sigma(x) \in V_{L,\tau,b(x)}$ such that $\deg(\sigma(x)) = \tau$, then:

$$\dim^*(V_{N,\tau,b(x)}) = (L-N)/2.$$

Proof. For $i \geq 1$ write, $V_i = V_{i,\tau,b(x)}$. Recall that by lemma 5 $\dim^*(V_N) \geq (L-N)/2$. For $N \in [L]$ and $\lambda(x) = \sum_{0 \leq j \leq \tau} \lambda_j x^j \in F[x]$ such that $\lambda_0 = 1$, it holds that: $\lambda(x) \in V_N$ iff $$\lambda(x) \cdot b(x) = \lambda'(x) \pmod{x^N}, \quad (1)$$

This is equivalent to:

i linear equation $L_i := \sum_{0 \leq j \leq i} \lambda_j \cdot b_{i-j} + (i+1) \cdot \lambda_{i+1} = 0$ for all $0 \leq i \leq N-1$ (we define $\lambda_j = 0$ for $j > \tau$). (2)

Note that the i linear equation is independent of N. By lemma 3 above when $N \in [L-1]$ is odd, then $$\lambda(x) \cdot b(x) = \lambda'(x) \pmod{x^N} \text{ implies } \lambda(x) \cdot b(x) = \lambda'(x) \pmod{x^{N+1}}$$

Thus, by the fact above, the formal linear equation $L_N$ is linearly dependent on the formal linear equations $L_1, \ldots, L_{N-1}$ (seen as a vector of coefficients in $F^{\tau+1}$) over F. It follows that (1) is equivalent to:

$L_i := \sum_{0 \leq j \leq i} \lambda_j \cdot b_{i-j} + i \cdot \lambda_{i+1} = 0$ for all even $i \in \{0, \ldots, N-1\}$. (3)

By Lemma 5 above $V_L = \{\sigma(x)\}$, i.e. $\dim^*(V_L) = 0$. Thus when we put in (3) $N = L$ we get that $\{L_i : i \in \{0, 2, 4, \ldots, L-2\}\}$ is an independent set of $\tau$ formal linear equations in $\tau$ unknowns. Thus for even $N \in [L]$ we get $V_N$ is the set of solutions of $\{L_i : i \in \{0, 2, \ldots, N-2\}\}$. Hence, we reduced the number of independent linear equations by $(L-N)/2$ and therefore $\dim(V_N) = (L-N)/2$. ◆

Comment. This proof is also an alternative proof to the uniqueness lemma 2 below. ◆

1.7 Example Related to the Dimension Equality
We had $L_i := \sum_{0 \leq j \leq i} \lambda_j \cdot b_{i-j} + (i+1) \cdot \lambda_{i+1} = 0$ for all $0 \leq i \leq N-1$ (we define $\lambda_j = 0$ for $j > \tau$).

Therefore $$L_0 := \lambda_0 \cdot b_0 + \lambda_1 = b_0 + \lambda_1 = 0,$$

$$L_1 := \lambda_0 \cdot b_1 + \lambda_1 \cdot b_0 = b_1 + \lambda_1 \cdot b_0 = 0.$$

Note that $b_1 + \lambda_1 \cdot b_0 = b_0^2 + \lambda_1 \cdot b_0 = b_0 \cdot (b_0 + \lambda_1)$, thus $L_1$ is linearly depends on $L_0$.

1.8 Applying the Dimension Equality to the Syndrome Polynomial of BCH
Let $t \geq r \geq 1$ $d = 2t+1$, $n > k \geq 1$, where $n^* - k^* = d$, and consider an $[n^*, k^*]$ BCH code, and a transmitted codeword has $\tau = t + r$ errors that are located at $E = \{\alpha_1, \ldots, \alpha_\tau\} \subseteq F^*$. Set $E' = \{1/\beta : \beta \in E_0\}$.
Define for $0 \leq k \leq 2\tau - 1$ the syndromes:

$$S_k = \sum_{1 \leq j \leq t+r} \alpha_j^{k+1} \text{ for all } 0 \leq k \leq 2\tau - 1.$$

The decoder knows the syndromes $\{S_k\}_{0 \leq k \leq d-2}$. Define the syndrome polynomial:

$$S(x) = \sum_{0 \leq k \leq 2\tau - 1} S_k x^k,$$

and define the ELP:

$$\lambda^*(x) = \Pi_{1 \leq j \leq r}(1 - x \cdot \alpha_j) \in F[x].$$

By lemma 2:

$$\lambda^*(x) \cdot S(x) = \lambda^{*\prime}(x) \pmod{x^{2\tau}}.$$

Thus by lemma 7 the affine space $V_{2\tau,\tau,S(x)}$ has dimension 0 and,
(*1) the affine space $V = V_{2t,\tau,S(x)}$ has dimension r.
In the following section, this (low) dimension of V plays a role in enabling low complexity. Note that $V = \{\lambda(x) \in F[x] : \lambda(x) \cdot S(x) = \lambda'(x) \pmod{x^{2t}}, \lambda(0) = 1 \deg(\lambda(x)) \leq \tau\}$.

The decoder "knows" this space and can find a basis to it.
2. Analysis of the BCH Key Equations II
2.1 Polynomial Divisions for Key Equations Solutions
The recurrence order of $(\lambda(x), \sigma(x)) \in F[x]^2$, denoted by $\text{ord}(\lambda, \sigma)$, is defined as $$\text{ord}(\lambda, \sigma) = \max\{\deg \lambda, 1 + \deg \sigma\}. ◆$$

Lemma 8.
I. Take even $N \geq 1$ $\lambda(x), \gamma(x), b(x) \in F[x]$, $b(x) = \sum_{0 \leq k \leq N-1} b_k x^k$, and suppose:

(1) $\lambda(0) = 1$ (2) $\lambda(x) \cdot b(x) = \gamma(x) \pmod{x^N}$.

(3) $\text{ord}(\lambda, \gamma) \leq N/2$, and $(\lambda(x), \gamma(x))$ is the pair with minimal order for which (1)-(3) holds. It then holds that $\gcd(\lambda(x), \gamma(x)) = 1$. Take now $\sigma(x), \omega(x), \in F[x]$, be such that the same holds:

(1) $\sigma(0) = 1$ (2) $\sigma(x) \cdot b(x) = \omega(x) \pmod{x^N}$.

(3) $\text{ord}(\sigma, \omega) \leq N/2$.

There then exists $c(x) \in F[x]$ such that $c(0) = 1$, $\deg(c(x)) \geq 1$ and $\sigma(x) = \lambda(x) \cdot c(x)$ and $\omega(x) = \gamma(x) \cdot c(x)$.
II. If we add the assumption that:

(4) $\lambda'(x) = \gamma(x)$ and $\sigma'(x) = \omega(x)$, it then holds there exists $u(x) \in F[x]$, such that $u(0) = 1$ and $c(x) = u(x)^2$. [II. follows also from I. and lemma 10 below].
III. It follows the that the other direction of I is also true: if $\lambda(x), \gamma(x) \in F[x]$ satisfy (1)-(3) and $\gcd(\lambda(x), \gamma(x)) = 1$ then $(\lambda(x), \gamma(x))$ is the pair with minimal order for which (1)-(3) holds.
Proof.
I. If there was $g(x) \in F[x]$ such that $g(x) | \lambda(x)$ and $g(x) | \gamma(x)$ and $\deg(g(x)) > 0$ then $g(0) \neq 0$ and hence we would have $g(0) \cdot (\lambda(x)/g(x)) \cdot b(x) = g(0) \cdot (\gamma(x)/g(x)) \pmod{x^N}$ and contradiction to the minimality of $\lambda(x)$. Thus $\gcd(\lambda(x), \gamma(x)) = 1$.

Next, it holds that $b(x)=\gamma(x)/\lambda(x) \pmod{x^N}$ and $b(x)=\omega(x)/\sigma(x) \pmod{x^N}$. Therefore:

$$\gamma(x)/\lambda(x)=\omega(x)/\sigma(x) \pmod{x^N},$$

implying:

$$\gamma(x)\cdot\sigma(x)=\omega(x)\cdot\lambda(x) \pmod{x^N},$$

and therefore by (3):

$$\gamma(x)\cdot\sigma(x)=\omega(x)\cdot\lambda(x).$$

Since $(\lambda(x),\gamma(x))=1$ it follows that $\lambda(x)|\sigma(x)$. Let $c(x)=\lambda(x)/\sigma(x)$, it then holds that $c(0)=1$ and:

$$\gamma(x)\cdot\lambda(x)\cdot c(x)=\omega(x)\cdot\lambda(x) \text{ that is:} \gamma(x)\cdot c(x)=\omega(x). \blacklozenge$$

II. Here we assume $\lambda'(x)=\gamma(x)$ and $\sigma'(x)=\omega(x)$. Since $\sigma(x)=\lambda(x)\cdot c(x)$ then $\sigma'(x)=\lambda'(x)\cdot c(x)+\lambda(x)\cdot c'(x)$ thus $\omega(x)=\gamma(x)\cdot c(x)+\lambda(x)\cdot c'(x)$ implying that $$\lambda(x)\cdot c'(x)=0, \text{that is } c'(x)=0.$$

Claim: for $p(x)\in F[x]$, if $p'(x)=0$ then $p(x)=q(x)^2$ for some $q(x)\in F[x]$.
Proof: put $$p(x)=\Sigma_{0\leq i\leq n} a_i x^i \text{ then } p'(x)=\Sigma_{1\leq i\leq n,\, i\text{ odd}} a_i x^{i-1}.$$

It follows from $p'(x)=0$ that:

$$p(x)=\Sigma_{0\leq i\leq n,\, i\text{ even}} a_i x^i,$$

thus:

$$p(x)=(\Sigma_{0\leq i\leq n,\, i\text{ even}} (a_i)^{1/2}\cdot x^{i/2})^2$$

2.2 Polynomial Divisions for Key Equations Solutions—BCH Generalization
Lemma 9. Take $N\geq 1$ $\sigma(x)$, $\lambda(x)\in F[x]$, $\sigma(0)=\lambda(0)=1$ and $b(x)=\Sigma_{0\leq k\leq N-1} b_k x^k \in F[x]\setminus\{0\}$ and suppose:

(1) $\lambda(x)\cdot b(x)=\lambda'(x) \pmod{x^N}$ and $\sigma(x)\cdot b(x)=\sigma'(x) \pmod{x^N}$ (2) $N\geq \deg(\lambda(x))+\deg(\sigma(x))$ (3) $\sigma(x)|\lambda(x)$ Then there exists $\omega(x)\in F[x]$, such that $\omega(0)=1$ and $\lambda(x)=\omega(x)^2\cdot\sigma(x)$.
Proof. Let K be an extension field of F that contains all $\lambda(x)$ roots and all $\sigma(x)$ roots. Represent $\lambda(x)$ and $\sigma(x)$ by:

(4) $\lambda(x)=\Pi_{1\leq j\leq s}(1-x\cdot\alpha_j)^{r(j)}$ and $\sigma(x)=\Pi_{1\leq j\leq s'}(1-x\cdot\alpha'_j)^{r'(j)}$, where $\alpha_1, \ldots, \alpha_s \in K^*$ are mutually different and $r(j)\geq 1$. Likewise $\alpha'_1, \ldots, \alpha'_{s'} \in K^*$ are mutually different and $r'(j)\geq 1$. Define A to be the symmetric difference of $\{\alpha_j:1\leq j\leq s, r(j) \text{ is odd}\}$ and $\{\alpha'_j:1\leq j\leq s', r'(j) \text{ is odd}\}$. It follows from lemma 2 that for $0\leq k\leq N-1$:

$$\Sigma_{1\leq j\leq s,\, r(j) \text{ is odd}} \alpha_j^{k+1} = b_k = \Sigma_{1\leq j\leq s',r'(j) \text{ is odd}} \alpha'^{k+1}_j.$$

That is, $$0=\Sigma_{1\leq j\leq s,\, r(j) \text{ is odd}} \alpha_j^{k+1}+\Sigma_{1\leq j\leq s',\, r'(j) \text{ is odd}} \alpha'^{k+1}_j=\Sigma_{\beta\in A}\beta^{k+1}.$$

If $A\neq \varnothing$ we get a contradiction since this yields linear dependency of the columns of a $N\times |A|$ Vandermonde matrix where $|A|\leq s+s'\leq N$. Thus $A=\varnothing$ and hence $s=s'$ and:

$$\{\alpha_j:1\leq j\leq s, r(j) \text{ is odd}\}=\{\alpha'_j:1\leq j\leq s', r'(j) \text{ is odd}\}.$$

Define $$f(x)=\Pi_{1\leq j\leq s,\, r(j) \text{ is odd}}(1-x\cdot\alpha_j).$$

By the above, there are polynomials $g(x)$ and $h(x)$ in $F[x]$ such that $g(0)=h(0)=1$ and:

(5) $\lambda(x)=(g(x))^2\cdot f(x)$ and $\sigma(x)=(h(x))^2\cdot f(x)$.

Since $\sigma(x)|\lambda(x)$ then $h(x)|g(x)$. Define $\omega(x)=g(x)/h(x)$ then $\omega(0)=1$ and $\omega(x)^2\cdot\sigma(x)=\lambda(x)$. $\blacklozenge$ 2.3 Continuation Principle for Reed-Solomon (RS)
Lemma 10. Take $N\geq 1$ $\lambda(x)$, $\gamma(x), b(x)\in F[x]$, $\lambda(0)=1$, $b(x)=\Sigma_{0\leq k\leq N-1} b_k x^k$, $\lambda(x)=\Sigma_{0\leq k\leq\tau}\lambda_k x^k$ and suppose:

(1) $\lambda(x)\cdot b(x)=\gamma(x) \pmod{x^N}$.

(2) $\deg(\gamma(x))<\tau<N$.

It then holds for every $L>N$ that there exists unique $\{b_k:N<k\leq L\}\subseteq F$ such that for (3) $B(x)=\Sigma_{0\leq k\leq L-1} b_k x^k$:

(4) $\lambda(x)\cdot B(x)=\gamma(x) \pmod{x^L}$.

Proof. Define for $k=N:(L-1)$ define, inductively, in increasing order:

(5) $b_k=\Sigma_{1\leq j\leq\tau}\lambda_j\cdot b_{k-j}$.

Since $\lambda_0=1$ it is equivalent to (6) $0=\Sigma_{0\leq j\leq\tau}\lambda_j\cdot b_{k-j}$.

This with (1) is equivalent to (4). The uniqueness follows by induction since (6) implies (5). $\blacklozenge$ 2.4 Continuation Principle for BCH
Lemma 11. Take $L>N\geq 1$ $\lambda(x)\in F[x]$, $\lambda(0)=1$ and $b(x)=\Sigma_{0\leq k\leq N-1} b_k x^k \in F[x]$ and suppose that:

(1) $\lambda(x)\cdot b(x)=\lambda'(x) \pmod{x^N}$ and $\deg(\lambda(x))<N$.

There then exists $\{b_k:N\leq k<L\}\subseteq F$ such that (2) for odd $0<k<L$ it holds that $b_k=b^2_{(k-1)/2}$, and for $B(x)=\Sigma_{0\leq k\leq L-1} b_k x^k$:

(3) $\lambda(x)\cdot B(x)=\lambda'(x) \pmod{x^L}$.

Note that by lemma 9 these $\{b_k:N<k\leq L\}$ are unique.
Proof. Let K be an extension field of F that contains all $\lambda(x)$ roots. Represent $\lambda(x)$ by: $\lambda(x)=\Pi_{1\leq j\leq s}(1-x\cdot\alpha_j)^{r(j)}$ where $\alpha_1, \ldots, \alpha_s \in K$ are mutually different and $r(j)\geq 1$. By lemma 2 it follows from $\lambda(x)\cdot b(x)=\lambda'(x) \pmod{x^N}$ that:

$$b_k=\Sigma_{1\leq j\leq s,\, r(j) \text{ is odd}} \alpha_j^{k+1} \text{ for all } 0\leq k\leq N-1.$$

Define now:

$$b_k=\Sigma_{1\leq j\leq s,\, r(j) \text{ is odd}} \alpha_j^{k+1} \text{ for all } N\leq k\leq L-1.$$

Then (2) follows and by the other direction of lemma 2 that (3) holds for $B(x)=\Sigma_{0\leq k\leq L-1} b_k x^k \blacklozenge$ 2.5 BCH Probability Bound for Key Equations Solutions 1 (PB1)
Lemma 12. Take $t>s\geq 1$, and randomly sample an odd-square $b(x)=\Sigma_{0\leq k<2t} b_k x^k \in F[x]$, with uniform distribution.
I. The probability that there exists separable $\lambda(x)\in F[x]$ such that:

(1) $\lambda(x)\cdot b(x)=\lambda'(x) \pmod{x^{2t}}$ and $\lambda(0)=1$ and $\deg(\lambda(x))=t-s$, is upper bounded by $q^{-s}$.

II. The probability that there exists any polynomial $\lambda(x) \in F[x]$ such that (1) holds is upper bounded by $q^{-s}/(1-1/q^2)$
Proof.
I. Recall that the set of odd-square polynomials of degree $<2t$, is:

$V = \{b(x) = \Sigma_{0 \leq k < 2t} b_k x^k \in F[x]$: for all $0 \leq k < t-1$: $b_k^2 = b_{2+1}\}$.

Define now:

$W = \{\lambda(x) \in F[x]: \lambda(x)$ is separable, $\lambda(0) = 1$, and $\deg(\lambda(x)) = t-s\}$.

Note that when $b(x) \in V$ and $\lambda(x) \in W$ satisfies $\lambda(x) \cdot b(x) = \lambda'(x) \pmod{x^{2t}}$, it also satisfies:

(2) $\lambda(x) \cdot b(x) = \lambda'(x) \pmod{x^{2t-2s}}$ and $\lambda(0) = 1$ and $\deg(\lambda(x)) = t-s$.

For $\lambda(x) \in W$ and $1 \leq j \leq t$, define:

$U_{\lambda(x),j} = \{b(x) \in V: \lambda(x) \cdot b(x) = \lambda'(x) \pmod{x^{2j}}\}$.

By lemma 11 and its proof, $U_{\lambda(x),t}$ contains exactly one polynomial and by (2) this polynomial is also in $U_{\lambda(x),t-s}$. On the other hand, it is clear from the definition and from lemma 10 and its proof that, for $b(x) = \Sigma_{0 \leq k < 2t} b_k x^k \in U_{\lambda(x),t-s}$ it holds that $A = \{b_k: 0 \leq k < 2(t-s)\}$ are uniquely determined by the key equations and $B = \{b_k: 2(t-s) \leq k < 2t, k$ is even$\}$ can be chosen freely from F and $C = \{b_k: 2(t-s) \leq k < 2t, k$ is odd$\}$ are uniquely determined by A and B through the equation $b_k^2 = b_{2k+1}$ (for all $0 \leq k < t-1$). It follows that:

$|U_{\lambda(x),t-s}| = q^s$.

Next note that by lemma 11 and its proof for $\lambda_1(x)$ and $\lambda_2(x) \in W$ such that $\lambda_1(x) \neq \lambda_2(x)$ it holds that $U_{\lambda_1(x),t-s} \cap U_{\lambda_2(x),t-s} = \emptyset$.

Now, randomly sample $b(x)$ from V with uniform distribution and let R be the event that $b(x)$ is in:

$U = \cup_{\lambda(x) \in W} U_{\lambda(x),t-s}$.

Then for some $\lambda(x) \in W$ it holds that, $b(x)$ is an (random) element of $U_{\lambda(x),t-s}$. Hence by the above the probability that $b(x)$ is in $U_{\lambda(x),t}$ is exactly $q^{-s}$. It follow that the probability that there exists separable $\lambda(x) \in F[x]$ such that (1) holds is:

$Pr(R) \cdot q^{-s}$, which proves I.
II. It follows from UL1 above (see section 1.4) that that if $\lambda(x) \in F[x]$ satisfies (1) above, then there are unique polynomial $\lambda_1(x), u(x) \in F[x]$, such that:

$\lambda_1(x) \cdot u^2(x) = \lambda(x)$ and $\lambda_1(0) = u(0) = 1$ and $\lambda_1(x)$ is separable, (a1)

and $\lambda_1(x) \cdot b(x) = \lambda_1'(x) \pmod{x^{2t}}$. (a2)

Note that $u(x)$ can also be 1. Let $j = \deg(u(x))$, then and $\deg(\lambda_1(x)) = t-s-2j$. It was proved above that the probability that when we sample $b(x)$ randomly from V, (a2) will be satisfied, is upper bounded by $q^{-s-2j}$. Thus the probability that (1) is satisfied is upper bounded by:

$q^{-s} \cdot (1 + q^{-2} + q^{-4} + \ldots) = q^{-s}/(1-1/q^2)$ ♦

2.6 General Polynomial Division Principles Related to RS and BCH
Interpolation. For $\gamma_1, \ldots, \gamma_N$, distinct elements of $F^*$, and for every $p(x) \in F[x]$ with $\deg(p(x)) < N$ there exists unique coefficients $a_1, \ldots, a_N \in F$ such that $p(x) = \Sigma_{j \in [N]} a_j \cdot \Pi_{i \in [N] \setminus [j]} (1 - x \cdot \gamma_i)$.

Proof. For $j \in [N]$ define $p_j(x) = \Pi_{i \in [N] \setminus [j]} (1 - x \cdot y_i)$. It is sufficient to prove that $\{p_j(x)\}_{j \in [N]}$ are linearly independent. Take $a_1, \ldots, a_N \in F$ and define $p(x) = \Sigma_{j \in [N]} a_j \cdot p_j(x)$, it then holds for $j \in [N]$ that $p(1/\gamma_j) = a_j \cdot \Pi_{i \in [N] \setminus [j]} (1 - \gamma_i/\gamma_j)$.

Thus if $p(x) = 0$ then $a_j = 0$ for all $j \in [N]$. ♦

Lemma 13. Take $N \geq 1$, and any polynomials $\lambda(x), \sigma(x) \in F[x]$ (of any degrees) such that $\lambda(0) = 1$. There then exists a unique polynomial $b(x) = \Sigma_{0 \leq k < N} b_k x^k \in F[x] \in F[x]$ such that $\lambda(x) \cdot b(x) = \sigma(x) \pmod{x^N}$. (1)

Proof. We represent $\lambda(x) = 1 + x \cdot \lambda_1(x)$, where $\lambda_1(x) \in F[x]$. (1) implies that:

$b(x) = \sigma(x) / (1 + x \cdot \lambda_1(x)) \pmod{x^N} = \sigma(x) \cdot (\Sigma_{0 \leq i \leq N-1} (x \cdot \lambda_1(x))^i) \pmod{x^N}$. ♦

Lemma 14. Take any $M, N \geq 1$, and $\lambda(x), \sigma(x) \in F[x]$ such that $\lambda(x)$ is separable and $\lambda(0) = 1$ and $M = \deg(\lambda(x)) > \deg(\sigma(x))$ and let $b(x) = \Sigma_{0 \leq k < N} b_k x^k \in F[x]$ be the unique polynomial (see lemma 13) such that:

$\lambda(x) \cdot b(x) = \sigma(x) \pmod{x^N}$. (1)

Let K be an extension field of F that contains all $\lambda(x)$ roots, we can represent $\lambda(x)$ by uniquely:

$\lambda(x) = \Pi_{1 \leq j \leq M} (1 - x \cdot \alpha_j)$, where $\alpha_1, \ldots, \alpha_t \in K^*$ are distinct scalars.
There exists $a_1, \ldots, a_M \in F$ such that $b_k = \Sigma_{1 \leq j \leq M} \alpha_j \cdot \alpha_j^k$ for all $0 \leq k < N$. (2)

$a_1, \ldots, a_M$ are unique when $M \leq N/2$.
Proof. By the claim above there exists unique $a_1, \ldots, a_M \in F$ such that $\sigma(x) = \Sigma_{j \in [M]} a_j \cdot \Pi_{i \in [N] \setminus [j]} (1 - x \cdot \alpha_i)$.

It follows from (1) that:

$$b(x) = \sum_{j \in [M]} a_j / (1 - \alpha_j \cdot x)(\mathrm{mod}\, x^N)$$
$$= \sum_{j \in [M]} a_j \cdot \sum_{0 \leq i \leq N-1} (\alpha_j \cdot x)^i$$
$$= \sum_{0 \leq i \leq N-1} \sum_{j \in [M]} a_j \cdot (\alpha_j \cdot x)^i$$
$$= \sum_{0 \leq i \leq N-1} x^i \cdot \sum_{j \in [M]} a_j \cdot \alpha_j^i.$$

This proves (2). The uniqueness, when $M \leq N/2$, follows from the same Vandermonde independency argument as for the BCH. ♦

3. Analysis of the Key Equations III
3.1 The Uniqueness and Expansion Lemmas
For N, $\tau \geq 1$ and $b(x) \in F[x]$ we defined:

$V_{N,\tau,b(x)} = \{\lambda(x) \in F[x]: \lambda(x) \cdot b(x) = \lambda'(x) \pmod{x^N}, \deg(\lambda(x)) \leq \tau, \lambda(0) = 1\}$.

Note that for all $\lambda(x) \in V_{N,\tau,b(x)}$ the roots of $\lambda(x)$ are nonzero. The following lemma eliminates certain singularities in our solution. It implies that if the ELP in V then any polynomial in V that has r roots in W in common with the ELP is in fact that ELP.

Lemma 15 (Uniqueness Lemma 2 (UL2)). Let $t \geq 1$, $r \geq 1$ and $b(x) \in F[x]$ is odd-square, $b(x) = \Sigma_{0 \leq k < L} b_k x^k$ and suppose that $\lambda(x), \sigma(x) \in V = V_{2t,t+r,b(x)}$ wherein $\lambda(x)$ is separable. Suppose also that for some $D \subseteq F^*, |D| = r$, for every $\beta \in D$ that $\lambda(\beta^{-1}) = \sigma(\beta^{-1}) = 0$. It then holds that $\sigma(x) = \lambda(x)$.

Proof. Let K be an extension field of F that contains all $\lambda(x)$ roots and all $\sigma(x)$ roots. We can represent $\lambda(x)$ and $\sigma(x)$ by:

$$\lambda(x) = \Pi_{1 \leq j \leq t+r}(1 - x \cdot \alpha_j)$$

$$\sigma(x) = \Pi_{1 \leq j \leq t'+r}(1 - x \cdot \beta_j)^{r(j)}$$

Where $0 \leq t' \leq t$, $r(j) \geq 1$ and $\alpha_1, \ldots, \alpha_{t+r} \in K^*$ are mutually different and $\beta_1, \ldots, \beta_{t'+r} \in K^*$ are mutually different. Note that $D \subseteq \{\alpha_1, \ldots, \alpha_{t+r}\}$ and $D \subseteq \{\beta_1, \ldots, \beta_{t'+r}\}$. Thus we can assume without loss of generality that $\alpha_i = \beta_i \in D$ for $i \in [r]$. Let $B = \{i \in [r]: r_j \text{ is even}\}$ and $b = |B|$. Note that $t' \leq t - b$. By lemma 2 for all $0 \leq k \leq 2t-1$:

$$\Sigma_{1 \leq j \leq t+r} \alpha_j^{k+1} = b_k = \Sigma_{1 \leq j \leq t'+r, \, r(j) \text{ is odd}} \beta_j^{k+1}.$$

Thus for every $0 \leq k \leq 2t-1$:

$$\Sigma_{1 \leq j \leq t+r} \alpha_j^{k+1} + \Sigma_{1 \leq j \leq t'+r, \, r(j) \text{ is odd}} \beta_j^{k+1} = 0,$$

that is, $$\Sigma_{1 \leq j \leq r, \, r(j) \text{ is even}} \alpha_j^{k+1} + \Sigma_{r+1 \leq j \leq t+r} \alpha_j^{k+1} + \Sigma_{r+1 \leq j \leq t'+r, \, r(j) \text{ is odd}} \beta_j^{k+1} = 0.$$

Let $A_1 = \{\alpha_j : j \in B\}$, $A_2 = \{\alpha_j : r+1 \leq j \leq t+r\}$, $A_3 = \{\beta_j : r+1 \leq j \leq t'+r, r(j) \text{ is odd}\}$. It then holds that $|A_1| = b$ and $|A_2| = t$ and $|A_3| = t' \leq t - b$.

Thus $$|A_1| + |A_2| + |A_3| \leq b + t + (t-b) \leq 2t.$$

Note that $$A_1 \cap A_2 = A_1 \cap A_3 = \emptyset,$$

and define $$C = A_1 \cup A_2 \cup A_3 \setminus A_2 \cap A_3.$$

Then $|C| \leq 2t$ and by the above for every $0 \leq k \leq 2t-1$:

$$\Sigma_{\gamma \in C} \gamma^{k+1} = 0.$$

If C is not the empty set we get a contradiction since this yields linear dependency of the columns of a $(2t) \times |C|$ Vandermonde matrix where $|C| \leq 2t$. Thus $C = \emptyset$ and hence $A_1 = \emptyset$ and $A_2 \cup A_3 = A_2 \cap A_3$, that is $A_2 = A_3$. It follows that $\lambda(x) = \sigma(x)$. ♦

Recall that the transformation $x \rightarrow x^2$ is 1-1 linear transformation from F to F over $F_2$.

Lemma 16 (Expansion Lemma). Let $t \geq 1$, $r > s \geq 1$, and $b(x) \in F[x]$ is odd-square, $b(x) = \Sigma_{0 \leq k < L} b_k x^k$ and take $\lambda(x) \in V_{2t,t+r,b(x)}$ with $\deg(p(x)) = t+s$. It then holds for every $p(x) \in F(x)$ such that $p(0) = 1$ $\deg(p(x)) \leq (r-s)/2$ and $f(x) = p^2(x)$ that $f(x) \cdot \lambda(x) \in V_{2t,t+r,b(x)}$.

Proof. Note that $f'(x) = 0$ and hence for all $g(x) \in F[x] (f(x) \cdot g(x))' = f(x) \cdot g'(x)$, thus since $$\lambda(x) \cdot b(x) = \lambda'(x) \pmod{x^N}$$

Then $$f(x) \cdot \lambda(x) \cdot b(x) = f(x) \cdot \lambda'(x) \pmod{x^N} = (f(x) \cdot \lambda(x))' \pmod{x^N}.$$

In addition $\deg(f(x) \cdot \lambda(x)) \leq t+r$, and $(f \cdot \lambda)(1) = 1$. Thus $f(x) \cdot \lambda(x) \in V_{2t,t+r,b(x)}$.

3.2 The Dimension Bound 3 (DB3)

Lemma 17. Let $N, \tau \geq 1$, $b(x) = b(x) = \Sigma_{0 \leq k < N} b_k x^k \in F[x]$ is odd-square, then, if $V_{N,\tau,b(x)} \neq \emptyset$:

$$\Delta = \dim^*(V_{N,\tau+1,b(x)}) - \dim^*(V_{N,\tau,b(x)}) \leq 1.$$

Proof. Note that the case $\tau \geq N-1$ is trivial: if we add to any basis of $V_{N,\tau,b(x)}$, the polynomial $\lambda(x) = x^{\tau+1}$ we get a basis of $V_{N,\tau+1,b(x)}$, and hence in this case $\Delta = 1$. Assume henceforth that $\tau < N-1$. A polynomial $\lambda(x) = \Sigma_{0 \leq i \leq \tau} \lambda_i x^i \in F[x]$ is in $V_{N,\tau,b(x)}$ iff, $\lambda_0 = 1$ and $$\Sigma_{0 \leq i \leq k} \lambda_i \cdot b_{k-i} + (k+1) \lambda_{k+1} = 0 \text{ for all } 0 \leq k < N \text{(we define } \lambda_i = 0 \text{ for } i > \tau\text{)}.$$

Likewise a polynomial $\lambda(x) = \Sigma_{0 \leq i \leq \tau+1} \lambda_i x^i \in F[x]$ is in $V_{N,\tau+1,b(x)}$ iff $\lambda_0 = 1$ and $$\Sigma_{0 \leq i \leq k} \lambda_i \cdot b_{k-i} + (k+1) \lambda_{k+1} = 0 \text{ for all } 0 \leq k < N.$$

Let $\delta_{i,k}$ be the GF(2) Kronecker delta, i.e., for integers i,k: $\delta_{i,k} = 0_{GF(2)}$ if $i = j$ and $\delta_{i,k} = 1_{GF(2)}$ if $i \neq j$. Consider the following N row vectors in $F^{N+1}$:

$$v_0 = [b_0, 1, 0, \ldots, 0]$$

$$v_1 = [b_1, b_0, 0, \ldots, 0]$$

$$v_2 = [b_2, b_1, b_0, 1, \ldots, 0]$$

$$v_3 = [b_3, b_2, b_1, b_0, 0, \ldots, 0]$$

$$v_4 = [b_4, b_3, b_2, b_1, b_0, 1, 0, \ldots, 0]$$

$$v_5 = [b_5, b_4, b_3, b_2, b_1, b_0, 0, \ldots, 0]$$

$$v_6 = [b_6, b_5, b4_3, b_3, b_2, b_1, b_0, 1, 0, \ldots, 0]$$

$$V_{N-1} = [b_{N-1}, b_{N-2}, b_{N-3}, \ldots, b_2, b_1, b_0,],$$

and let A be the $N \times N$ matrix whose rows are $v_0, \ldots, v_{N-1}$ respectively. It then holds that a polynomial $\lambda(x) = 1 + \Sigma_{1 \leq i \leq \tau} \lambda_i x^i \in F[x]$ is in $V_{N,\tau,b(x)}$ iff $$A \cdot [1, \lambda_1, \ldots, \lambda_\tau, 0, \ldots, 0] = 0,$$

and a polynomial $$\lambda(x) = 1 + \Sigma_{1 \leq i \leq \tau+1} \lambda_i x^i \in F[x] \text{ is in } V_{N,\tau+1,b(x)} \text{ iff}$$

$$A \cdot [1, \lambda_1, \ldots, \lambda_\tau, \lambda_{\tau+1}, 0, \ldots, 0] = 0.$$

It follows that $\dim^*(V_{N,\tau+1,b(x)}) - \dim^*(V_{N,\tau,b(x)}) \leq 1$ ♦

As a corollary we get:

Lemma 18 (Dimension Bound 3)

Let $\tau \geq 1$, $s \geq 1$ $b(x) \in F[x]$ is odd-square, $b(x) = \Sigma_{0 \leq k < N} b_k x^k$. Then, if $V_{L,\tau,b(x)} \neq \emptyset$: $\dim^*(V_{N,\tau+s,b(x)}) - \dim^*(V_{N,\tau,b(x)}) \leq s$.

3.3 Dimension Bound 4 (DB4) on a Midway Degree ELP

Lemma 19 (Dimension Bound 4). Take $t \geq r \geq r' > r'' \geq 0$ and odd-square $b(x) \in F[x]$ and suppose that (*) there exists $\lambda(x) \in V_{2t+2r',t+r',b(x)}$ that is separable of degree $t+r'$.

It then holds that:

I. $\dim^*(V_{2t,t+r',b(x)}) = r'$ and $\dim^*(V_{2t,t+r,b(x)}) \leq r$.

II. Define $r^* = \max\{r_1: r_1 \leq r \text{ and } \dim(V_{2t,t+r(1),b(x)}) = r_1\}$. Then $r' \leq r^*$.

III. $\dim^*(V_{2t,t+r'',b(x)}) \geq r''$

Proof.
I. By the dimension equality:

$$\dim^*(V_{2t,t+r',b(x)}) = r'$$

and by DB3

$$\dim^*(V_{2t,t+r,b(x)}) - \dim^*(V_{2t,t+r',b(x)}) \leq r - r'.$$

It follows that:

$$\dim^*(V_{2t,t+r,b(x)}) \leq r.$$

II. Follows from the proof of I.
III. and by DB3 $\dim^*(V_{2t,t+r',b(x)}) - \dim^*(V_{2t,t+r'',b(x)}) \leq r' - r''$, therefore $\dim^*(V_{2t,t+r'',b(x)}) \geq r''$. ◆

4. Polynomial Degree Reduction Lemmas, and Probabilistic Bound 4.1 Reducing the Key Equations by One Degree Lemma 20. Take $b(x) = \Sigma_{0 \leq k < N-1} b_k x^k \in F[x]$ and $\lambda(x) \in F[x]$ with $\lambda(0) = 1$, and suppose that $$\lambda(x) \cdot b(x) = \lambda'(x) \pmod{x^N}, \quad (1)$$

and that $\alpha \in F^*$ is an inverse of a root of $\lambda(x)$, i.e., $(1-\alpha \cdot x) | \lambda(x)$. Define $$\lambda^*(x) = \lambda(x)/(1-\alpha \cdot x) \text{ and } b^*(x) = \Sigma_{0 \leq k < N-1}(b_k + \alpha^{k+1}) \cdot x^j.$$

It then holds that:

$$\lambda^*(x) \cdot b^*(x) = \lambda^{*'}(x) \pmod{x^N} \quad (2)$$

Proof. Note that $$b(x) + \alpha/(1-\alpha x) \pmod{x^N} = b(x) + \Sigma_{0 \leq k < \infty} \square \alpha^{k+1} \cdot x^k = b^*(x) \pmod{x^N}$$

Thus by (1): $\lambda(x) \cdot b(x)^* = (1-\alpha \cdot x) \cdot \lambda^*(x) \cdot (b(x) + \alpha/(1-\alpha x)) \pmod{x^N} = ((1-\alpha \cdot x) \cdot \lambda^*(x))' + \alpha \cdot \lambda^*(x) \pmod{x^N} = ((1-\alpha \cdot x) \cdot \lambda^*(x))' + \alpha \cdot \lambda^*(x) \pmod{x^N} = (1-\alpha \cdot x) \cdot \lambda^*(x)' \pmod{x^N}$.

Therefore, dividing by $(1-\alpha x)$:

$$\lambda^*(x) \cdot (b(x) + \alpha/(1-\alpha x)) = \lambda^*(x)' \pmod{x^N},$$

which proves (2). ◆

4.2 Reducing the Key Equation by any Number of Degrees

As a corollary to lemma 20 we get that:

Lemma 21. Take $s \geq 1$, and $b(x) = \Sigma_{0 \leq k < N-1} b_k x^k \in F[x]$ and $\lambda(x) \in F[x]$ with $\lambda(0) = 1$, and suppose that $$\lambda(x) \cdot b(x) = \lambda'(x) \pmod{x^N}, \quad (1)$$

and that $\alpha_1, \ldots, \alpha_s \in F^*$ are mutually different inverses of roots of $\lambda(x)$, i.e., $(1-\alpha_i \cdot x) | \lambda(x)$, for $i \in [s]$ & $\alpha_i \neq \alpha_j$ for $i, j \in [s]$ $i \neq j$. Define $$\lambda^*(x) = \lambda(x)/(\Pi_{i \in [s]}(1-\alpha_i \cdot x)) \text{ and } b^*(x) = \Sigma_{0 \leq k < N-1}(b_k + \Sigma_{i \in [s]} \alpha_i^{k+1}) \cdot x^j.$$

It then holds that:

$$\lambda^*(x) \cdot b^*(x) = \lambda^{*'}(x) \pmod{x^N}. \quad (2)$$

4.3 BCH Probability Bound for Key Equations Solutions 2 (PB2)

Introduction. Next we arrive at a probabilistic observation. The following event A is a prototype of an event in the main soft decoding algorithm, wherein a solution to the key equation turns out to be a false ELP candidate, and hence requires some additional complexity. It will be shown that this event has probability close to $q^{-1}$ in first version and close to $q^{-2}$ in a second version. In the second version there are an insignificant number of false candidates and consequently insignificant added complexity due to a false alarm that requires a Chien search. ◆

Lemma 22. Take $t \geq r \geq 1$, $s \geq 1$, and $b(x) = \Sigma_{0 \leq k < 2t} b_k x^k \in F[x]$. Fix mutually different $\alpha_1, \ldots, \alpha_{r+s} \in F^*$. It holds that the probability of the following event, A, is upper bounded by $q^{-s}/(1-q^{-2})$.

The event A: There exists $\lambda(x) \in F[x]$ with $\lambda(0) = 1$, and $\deg(\lambda(x)) = t+r$ such that:

$$\lambda(x) \cdot b(x) = \lambda'(x) \pmod{x^{2t}}, \text{ and} \quad (1)$$

$$(1-\alpha_i x) | \lambda(x), \text{ for } i \in [r+s] \text{ \& } \alpha_i \neq \alpha_j \text{ for } i, j \in [r+s] i \neq j. \quad (2)$$

Proof. Define $$\lambda^*(x) = \lambda(x)/(\Pi_{i \in [r+s]}(1-\alpha_i \cdot x)), \text{ and } b^*(x) = \Sigma_{0 \leq k < N-1}(b_k + \Sigma_{i \in [r+s]} \alpha_i^{k+1}) \cdot x^j.$$

By lemma 21 it holds that:

$$\lambda^*(x) \cdot b^*(x) = \lambda^{*'}(x) \pmod{x^{2t}} \text{ and } \lambda^*(0) = 1. \quad (3)$$

Note also that $\deg(\lambda^*(x)) = t-s$. It follows from PB1 above that the probability of this event is upper bounded by $q^{-s}/(1-q^{-2})$.

5. Minimal Monotone Basis of Affine Space of Polynomials and Dimensional Setup 5.1 Minimal Monotone Basis A series of polynomials $\{p_i(x)\}_{1 \leq i \leq s}$ is called monotone if $\deg(p_i(x)) < \deg(p_{i+1}(x))$ for $i \in [s-1]$. For an s-dimensional subspace $U \subseteq F[x]$, $A = \{p_i(x)\}_{1 \leq i \leq s} \subseteq F[x]$ is called monotone basis if A is monotone and also a basis of U. Note while there can be many monotone bases to U, the sequence $\{\deg(p_i(x))\}_{1 \leq i \leq s}$ is unique for the given U, and is independent of the monotone basis we choose. $A = \{p_i(x)\}_{1 \leq i \leq s}$ is called canonic basis of U if every polynomial in A is monic and if for all $i \in [s]$, the coefficient of $x^j$ for $j = \deg(p_i(x))$ is zero for all $p_a(x)$, where $a \in [s]$, $a \neq i$. By [GU] below, the canonic basis is unique. Take $p^*(x) \in F[x] \setminus U$, and define the affine space $W = U + p^*(x)$. $B = \{p_i(x)\}_{1 \leq i \leq s+1} \subseteq F[x]$ is called monotone basis of W if $\{p_i(x)\}_{1 \leq i \leq s}$ is a monotone basis of U and $p_{s+1}(x) \in F[x] \setminus U$. B is called minimal monotone basis of W if B is monotone and $\deg(p_{s+1}(x))$ is minimal among all such bases. Note that when $B = \{p_i(x)\}_{1 \leq i \leq s+1} \subseteq F[x]$ is a minimal monotone basis of W, then $\deg(p_{s+1}(x))$ is not in $\{\deg(p_i(x))\}_{1 \leq i \leq s}$, and therefore $\deg(p_{s+1}(x)) = \min\{\deg(p(x)) : p(x) \in W\} \equiv \mu$. On the other hand if $p(x) \in U$ and $\deg(p(x)) = \mu$ and $\{p_i(x)\}_{1 \leq i \leq s}$ is any monotone basis of U then for $p_{s+1}(x) = p(x)$, it holds that $\{p_i(x)\}_{1 \leq i \leq s+1}$ is a minimal monotone basis of W.

5.2 Main Dimensional Setup for the Algorithm

Take $t \geq r \geq 1$ and odd-square $b(x) \in F[x]$ and set $V = V_{2t,t+r,b(x)}$. By the dimension equality, if there exists a separable $\sigma(x) \in V$ such that $\deg(\alpha(x)) = t+r$, then:

(*) $\dim^*(V) = r$.

In general, given $b(x)$ and $r$ we cannot know in advance if such $\sigma(x)$ exist, before operating the proceeding algorithm. However, owing to DB4 II (see section 3.3, above), (*) is the only case of interest for the ensuing algorithm. Thus let $\{\lambda_i(x)\}_{1 \leq i \leq r+1} \subseteq F[x]$ be a minimal monotone basis of V. Note that we can always find a minimal monotone basis to V by solving the associated linear equations, using Gaussian elimination. Let $\mu = \deg(\lambda_{r+1}(x))$. As mentioned above $$\mu = \min\{\deg(\lambda(x)) : \lambda(x) \in V\}. \text{ In fact } V_{2t,\mu,b(x)} = \{\lambda_{r+1}(x)\}$$
and for $1 \leq j$:

if $j < \mu$: $V_{2t,j,b(x)} = \emptyset$;

if $j \geq \mu$: $V_{2t,j,b(x)} \neq \emptyset$.

What is claimed is:

1. A digital electronic circuit, tangibly embodying a program of instructions executed by the digital electronic circuit to perform method steps for Bose-Chaudhuri-Hocquenghem (BCH) soft error decoding, comprising the steps of:
   receiving a codeword x through a digital electronic communication channel, wherein the received codeword x has $\tau=t+r$ errors for some $r\geq 1$, wherein $t=(d-1)/2$ and d is a minimal distance of a BCH code;
   computing a minimal monotone basis $\{\lambda_i(x)\}_{1\leq i\leq r+1}\subseteq F[x]$ of an affine space $V=\{\lambda(x)\epsilon F[x]:\lambda(x)\cdot S(x)=\lambda'(x) \pmod{x^{2t}}, \lambda(0)=1, \deg(\lambda(x))\leq t+r\}$, wherein $\lambda(x)$ is an error locator polynomial, $S(x)$ is a syndrome, and $F[x]=GF(q)$ wherein $q=2^m$ for $m>1$;
   computing a matrix $A\equiv(\lambda_j(\beta_i))_{i\in[w],\ j\in[r+1]}$, wherein $W=\{\beta_1, \ldots, \beta_w\}$ is a set of weak bits in x;
   processing for every subset $W'\subseteq W$ by retrieving from memory a set $W''=R(W')$, computing $B_{W''}$ by adding one row to $B_{W''}$ and performing Gaussian elimination operations on $B_{W''}$, wherein $R(W')$ is reliability probabilities of the bits in $W'$; and
   wherein when a first r' columns of $B_{W''}$ are a transpose of a systematic matrix and $\deg(\lambda(x))=t+r'$, wherein $1\leq r'\leq r$, performing:
      computing $u(x)=\gcd(\lambda(x), \lambda'(x))$, wherein $\lambda'(x)$ is a derivative of $\lambda(x)$;
      computing $\lambda(\Phi\backslash W')$ and deducting from it $Z_{\lambda(x),\Phi}$ wherein $Z_{\lambda(x),\Phi}=\{\beta\epsilon\Phi: \lambda(\beta)=0\}$, when $u(x)$ is a scalar in $F^*$;
      adding a pair $(\lambda(x), Z_{\lambda(x),\Phi})$ to set a L of all $(r', \lambda(x), Z_{\lambda(x),\Phi})$ such that $1\leq r'\leq r$, $\lambda(x)\epsilon V'_{r'}$, $|Z_{\lambda(x),W'}|\geq r'+1$, and $|Z_{\lambda(x),\Phi}|=t+r'$, when $|Z_{\lambda(x),\Phi}|=t+r'$; and
      outputting the set L to the digital electronic communication channel.

2. The method of claim 1, wherein the one row added to $B_{W''}$ is an arbitrary odd-square polynomial in the codeword x.

3. The method of claim 1, further comprising forming the error locating polynomial from coefficients in the set L, and flipping channel hard decisions at error locations found in the received codeword.

4. The method of claim 1, wherein $\lambda(x)\epsilon V_{r'}$ is unique and $\lambda(\beta)=0$ for every $\beta\epsilon W'$, when the first r' columns of $B_{W''}$ are a transpose of a systematic matrix.

5. The method of claim 1, further comprising terminating the processing of W' when $\deg(u(x))\geq 1$.

6. The method of claim 1, further comprising terminating the processing of W' when the first r' columns of $B_{W''}$ are not a transpose of a systematic matrix or $\deg(\lambda(x))\neq t+r'$.

7. The method of claim 1, further comprising, before computing $u(x)=\gcd(\lambda(x),\lambda'(x))$, computing, for every $r\geq\rho\geq r'+2$ and a pair $(W_1, \lambda_1(x))$ such that $\lambda(x)\epsilon V'_\rho$, and $W_1\subseteq W$ with $|W_1|=\rho+1$, wherein $\lambda_1(x)\epsilon V_\rho$ is a unique polynomial such that $\lambda_1(W_1)=0$, $\lambda_1'(\beta)$ for every $\beta$ in $W_1$.

8. The method of claim 5, further comprising terminating the processing of $W_1$ when for any $\beta$ in $W_1$, $\lambda_1'(\beta)=0$.

9. A non-transitory program storage device readable by a computer, tangibly embodying a program of instructions executed by the computer to perform method steps for a Bose-Chaudhuri-Hocquenghem (BCH) soft error decoding, comprising the steps of:
   receiving a codeword x through a digital electronic communication channel, wherein the received codeword x has $\tau=t+r$ errors for some $r\geq 1$, wherein $t=(d-1)/2$ and d is a minimal distance of a BCH code;
   performing error correction on the codeword to generate a corrected codeword; and
   outputting data included in the corrected codeword to the digital electronic communication channel,
   wherein performing the error correction comprises
      computing a minimal monotone basis $\{\lambda_i(x)\}_{1\leq i\leq r+1}\subseteq F[x]$ of an affine space $V=\{\lambda(x)\epsilon F[x]:\lambda(x)\cdot S(x)=\lambda'(x) \pmod{x^{2t}}, \lambda(0)=1, \deg(\lambda(x))\leq t+r\}$, wherein $\lambda(x)$ is an error locator polynomial, $S(x)$ is a syndrome, and $F[x]=GF(q)$ wherein $q=2^m$ for $m>1$;
      computing a matrix $A\equiv(\lambda_j(\beta_i))_{i\in[w],\ j\in[r+1]}$, wherein $W=\{\beta_1, \ldots, \beta_w\}$ is a set of weak bits in x;
      constructing a submatrix of r+1 rows from sub matrices of r+1 rows of the subsets of A such that the last column is a linear combination of the other columns;
      forming a candidate error locating polynomial using coefficients of the minimal monotone basis that result from the constructed submatrix;
      performing a fast Chien search wherein the candidate error locating polynomial is verified; and
      flipping channel hard decision at error locations found in the candidate error locating polynomial and returning the decoded codeword x.

10. The computer-readable program storage device of claim 9, wherein constructing a submatrix of r+1 rows from sub matrices of r+1 rows of the subsets of A such that the last column is a linear combination of the other columns comprises:
   processing for every subset $W'\subseteq W$ by retrieving from memory a set $W''=R(W')$, computing $B_{W''}$ by adding one row to $B_{W''}$ and performing Gaussian elimination operations on $B_{W''}$, wherein $R(W')$ is reliability probabilities of the bits in $W'$;
   wherein when a first r' columns of $B_{W''}$ are a transpose of a systematic matrix and $\deg(\lambda(x))=t+r'$, wherein $1\leq r'\leq r$, performing:
      computing $u(x)=\gcd(\lambda(x), \lambda'(x))$, wherein $\lambda'(x)$ is a derivative of $\lambda(x)$;
      computing $\lambda(\Phi\backslash W')$ and deducting from it $Z_{\lambda(x),\Phi}$ wherein $Z_{\lambda(x),\Phi}=\{\beta\epsilon\Phi: \lambda(\beta)=0\}$, when $u(x)$ is a scalar in $F^*$;
      adding a pair $(\lambda(x), Z_{\lambda(x),\Phi})$ to set a L of all $(r', \lambda(x), Z_{\lambda(x),\Phi})$ such that $1\leq r'\leq r$, $\lambda(x)\epsilon V'_{r'}$, $|Z_{\lambda(x),W'}|\geq r'+1$, and $|Z_{\lambda(x),\Phi}|=t+r'$, when $|Z_{\lambda(x),\Phi}|=t+r'$; and
   outputting the set L.

11. The computer-readable program storage device of claim 10, wherein the one row added to $B_{W''}$ is an arbitrary odd-square polynomial in the codeword x.

12. The computer-readable program storage device of claim 10, wherein $\lambda(x)\epsilon V_{r'}$ is unique and $\lambda(\beta)=0$ for every $\beta\epsilon W'$, when the first r' columns of $B_{W''}$ are a transpose of a systematic matrix.

13. The computer-readable program storage device of claim 10, the method further comprising terminating the processing of W' when $\deg(u(x))\geq 1$.

14. The computer-readable program storage device of claim 10, the method further comprising terminating the processing of W' when the first r' columns of $B_{W''}$ are not a transpose of a systematic matrix or $\deg(\lambda(x))\neq t+r'$.

15. The computer-readable program storage device of claim 10, the method further comprising, before computing $u(x)=\gcd(\lambda(x),\lambda'(x))$, computing, for every $r\geq\rho\geq r'+2$ and a pair $(W_1, \lambda_1(x))$ such that $\lambda(x)\epsilon V'_\rho$, and $W_1\subseteq W$ with $|W_1|=\rho+1$, wherein $\lambda_1(x)\epsilon V_\rho$ is a unique polynomial such that $\lambda_1(W_1)=0$, $\lambda_1'(\beta)$ for every $\beta$ in $W_1$.

16. The computer-readable program storage device of claim 15, the method further comprising terminating the processing of $W_1$ when for any $\beta$ in $W_1$, $\lambda_1'(\beta)=0$.

17. A computer memory-based product, comprising:
a memory; and
a digital circuit tangibly embodying a program of instructions executed by the computer to perform a method for a Bose-Chaudhuri-Hocquenghem (BCH) soft error decoding, wherein the method comprises the steps of:
receiving a codeword x through a digital electronic communication channel, wherein the received codeword x has $\tau=t+r$ errors for some $r\geq 1$, wherein $t=(d-1)/2$ and d is a minimal distance of a BCH code;
performing error correction on the codeword to generate a corrected codeword; and
outputting data included in the corrected codeword to the digital electronic communication channel,
wherein performing the error correction comprises
computing a minimal monotone basis $\{\lambda_i(x)\}_{1\leq i\leq r+1}\subseteq F[x]$ of an affine space $V=\{\lambda(x)\in F[x]:\lambda(x)\cdot S(x)=\lambda'(x) \pmod{x^{2r}}, \lambda(0)=1, \deg(\lambda(x))\leq t+r\}$, wherein $\lambda(x)$ is an error locator polynomial, $S(x)$ is a syndrome, and $F[x]$ GF(q) wherein $q=2^m$ for $m>1$;
computing a matrix $A\equiv(\lambda_j(\beta_i))_{i\in[w], j\in[r+1]}$, wherein $W=\{\beta_1,\ldots,\beta_w\}$ is a set of weak bits in x;
processing for every subset $W'\subseteq W$ by retrieving from memory a set $W''=R(W')$, computing $B_{W''}$ by adding one row to $B_{W'}$ and performing Gaussian elimination operations on $B_{W''}$, wherein $R(W')$ is reliability probabilities of the bits in $W'$;
wherein when a first r' columns of $B_{W''}$ are a transpose of a systematic matrix and $\deg(\lambda(x))=t+r'$, wherein $1\leq r'\leq r$, performing:
computing $u(x)=\gcd(\lambda(x),\lambda'(x))$, wherein $\lambda'(x)$ is a derivative of $\lambda(x)$;
computing $\lambda(\Phi\backslash W')$ and deducting from it $Z_{\lambda(x),\Phi}$ wherein $Z_{\lambda(x),\Phi}=\{\beta\in\Phi:\lambda(\beta)=0\}$, when $u(x)$ is a scalar in $F^*$;
adding a pair $(\lambda(x), Z_{\lambda(x),\Phi})$ to set a L of all (r', $\lambda(x)$, $Z_{\lambda(x),\Phi}$) such that $1\leq r'\leq r$, $\lambda(x)\in V'_{r'}$, $|Z_{\lambda(x),W}|\geq r'+1$, and $|Z_{\lambda(x),\Phi}|=t+r'$, when $|Z_{\lambda(x),\Phi}|=t+r'$; and
outputting the set L.

18. The computer memory-based product of claim 17, wherein the memory is at least one of a solid-state drive, a universal flash storage, or a DRAM.

* * * * *